(12) United States Patent
Mokhlesi et al.

(10) Patent No.: US 7,851,851 B2
(45) Date of Patent: Dec. 14, 2010

(54) THREE DIMENSIONAL NAND MEMORY

(75) Inventors: Nima Mokhlesi, Los Gatos, CA (US); Roy Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 739 days.

(21) Appl. No.: 11/691,939

(22) Filed: Mar. 27, 2007

(65) Prior Publication Data
US 2008/0237602 A1    Oct. 2, 2008

(51) Int. Cl.
*H01L 29/792*    (2006.01)
(52) U.S. Cl. .............. 257/326; 257/67; 257/E29.131; 257/E29.134; 257/E29.262
(58) Field of Classification Search ............. 257/67, 257/74, 302, 325, 326, 391, E29.131, E29.134, 257/E29.262; 438/268; 365/185.17
See application file for complete search history.

(56) References Cited

U.S. PATENT DOCUMENTS

| | | | |
|---|---|---|---|
| 4,786,615 A | 11/1988 | Liaw et al. | |
| 5,874,760 A | 2/1999 | Burns, Jr. et al. | |
| 5,915,167 A | 6/1999 | Leedy et al. | |
| 5,929,477 A | 7/1999 | McAllister, Jr. et al. | |
| 5,981,350 A | 11/1999 | Geusic et al. | |
| 6,034,882 A * | 3/2000 | Johnson et al. | 365/103 |
| 6,180,458 B1 | 1/2001 | Krautschneider et al. | |
| 6,211,015 B1 | 4/2001 | Noble | |
| 6,242,775 B1 | 6/2001 | Noble | |
| 6,388,293 B1 | 5/2002 | Ogura et al. | |
| 6,580,124 B1 | 6/2003 | Cleeves et al. | |
| 6,727,544 B2 | 4/2004 | Endoh et al. | |
| 6,744,094 B2 | 6/2004 | Forbes | |
| 6,858,899 B2 | 2/2005 | Mahajani et al. | |
| 6,881,628 B2 | 4/2005 | Rudeck | |
| 6,881,994 B2 * | 4/2005 | Lee et al. | 257/296 |
| 6,906,953 B2 | 6/2005 | Forbes | |
| 7,009,888 B2 * | 3/2006 | Masuoka et al. | 365/185.28 |
| 7,115,476 B1 | 10/2006 | Izumida | |
| 7,253,055 B2 | 8/2007 | Mokhlesi et al. | |
| 7,378,702 B2 | 5/2008 | Lee | |
| 7,514,321 B2 | 4/2009 | Mokhlesi et al. | |

(Continued)

FOREIGN PATENT DOCUMENTS

EP    1179850 A2    2/2002

(Continued)

OTHER PUBLICATIONS

NG, Complete Guide to Semiconductor Devices, 2002, John Wiley & Sons, 2nd Ed., pp. 353-358.*

(Continued)

*Primary Examiner*—Eugene Lee
*Assistant Examiner*—Tucker Wright
(74) *Attorney, Agent, or Firm*—The Marbury Law Group PLLC

(57) ABSTRACT

A monolithic, three dimensional NAND string includes a first memory cell located over a second memory cell. A semiconductor active region of the first memory cell is formed epitaxially on a semiconductor active region of the second memory cell, such that a defined boundary exists between the semiconductor active region of the first memory cell and the semiconductor active region of the second memory cell.

20 Claims, 20 Drawing Sheets

U.S. PATENT DOCUMENTS

| | | |
|---|---|---|
| 2002/0028541 A1 | 3/2002 | Lee et al. |
| 2002/0058381 A1 | 5/2002 | Lee |
| 2003/0048666 A1 | 3/2003 | Eldridge et al. |
| 2005/0035399 A1 | 2/2005 | Masuoka et al. |
| 2005/0133851 A1 | 6/2005 | Forbes |
| 2005/0167759 A1 | 8/2005 | Matsui et al. |
| 2005/0184329 A1 | 8/2005 | Prall |
| 2005/0224847 A1 | 10/2005 | Masuoka et al. |
| 2006/0001078 A1 | 1/2006 | Liu |
| 2008/0237602 A1 | 10/2008 | Mokhlesi et al. |

FOREIGN PATENT DOCUMENTS

| | | |
|---|---|---|
| JP | 7-235649 | 9/1995 |
| WO | WO 02/15277 A2 | 2/2002 |

OTHER PUBLICATIONS

Office Action dated Nov. 10, 2008 received in U.S. Appl. No. 11/691,917.

Office Action dated Feb. 5, 2009 received in U.S. Appl. No. 11/691,858.

Office Action dated Jul. 1, 2009 received in U.S. Appl. No. 11/691,901.

Office Action dated Jul. 7, 2009 received in U.S. Appl. No. 11/691,885.

Office Action dated Jan. 12, 2010 received in U.S. Appl. No. 11/691,885.

Office Action dated Jan. 20, 2010 received in U.S. Appl. No. 11/691,858.

Pein, Howard B. et al., "Performance of the 3-D Sidewall Flash EPROM Cell", IEDM Conf. Proc., (1993), pp. 2.1.1-2.1.4.

Endoh, Tetsuo et al., "Novel Ultra High Density Flash Memory with a Stacked-Surrounding Gate Transistor (S-SGT) Structured Cell", IEDM Conf. Proc., (2001), pp. 2.3.1-2.3.4.

Endoh, Tetsuo et al., "Novel Ultrahigh-Density Flash Memory With a Stacked-Surrounding Gate Transistor (S-SGT) Structured Cell", IEEE Transactions on Electron Devices, (2003), pp. 945-951, vol. 50, No. 4.

Sato, Nobuhiko et al., "Hydrogen annealed silicon-on-insulator", Appl. Phys. Lett , (1994), pp. 1924-1926, vol. 65, No. 15.

Zhong, Lei et al., "Surface modification of silicon (111) by annealing at high temperature in hydrogen", Appl. Phys. Lett , (1996), pp. 2349-2351, vol. 68, No. 17.

Zaman, Rownak J. et al., "Effects of Hydrogen Annealing Process Conditions on Nano Scale Silicon (011) Fins", Mater. Res. Soc. Symp. Proc., (2005), pp. J3.1.1-J3.1.5, vol. 872.

Lee, Jeong-Soo et al., "Hydrogen Annealing Effect on DC and Low-Frequency Noise Characteristics in CMOS FinFETs", IEEE Electron Device Letters, (2003), pp. 186-188, vol. 24, No. 3.

U.S. Appl. No. 11/691,858, filed Mar. 27, 2007, Nima Mokhlesi et al.

U.S. Appl. No. 11/691,885, filed Mar. 27, 2007, Nima Mokhlesi et al.

U.S. Appl. No. 11/691,901, filed Mar. 27, 2007, Nima Mokhlesi et al.

U.S. Appl. No. 11/691,917, filed Mar. 27, 2007, Nima Mokhlesi et al.

* cited by examiner

Cross section extending along word line direction

Top view

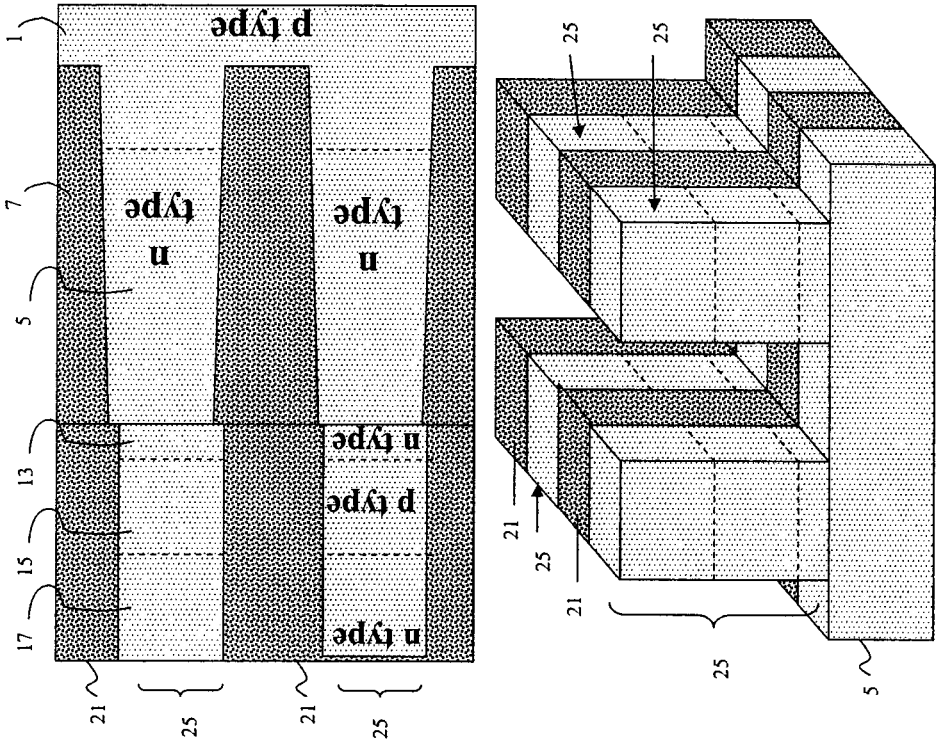
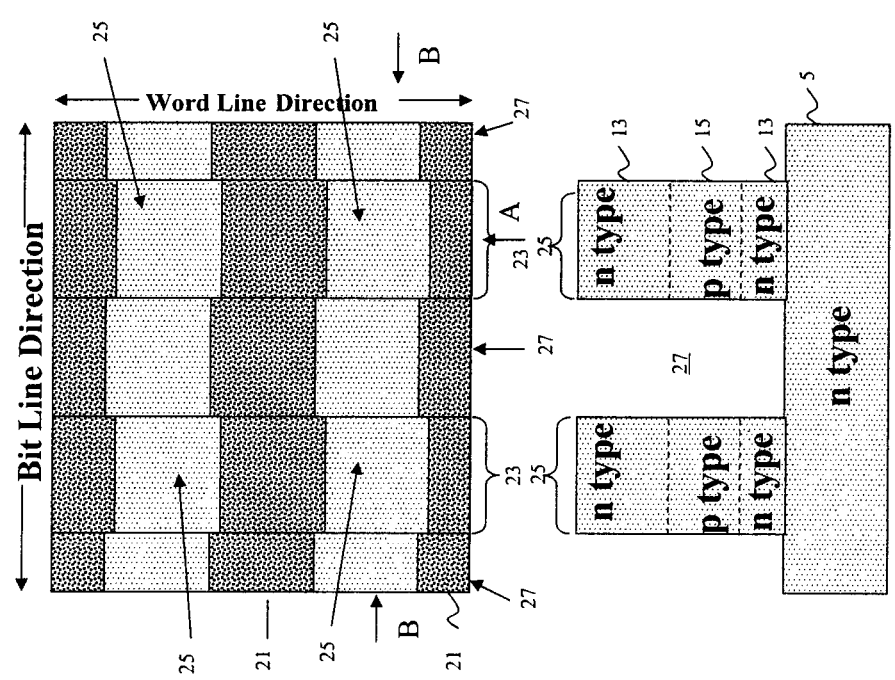

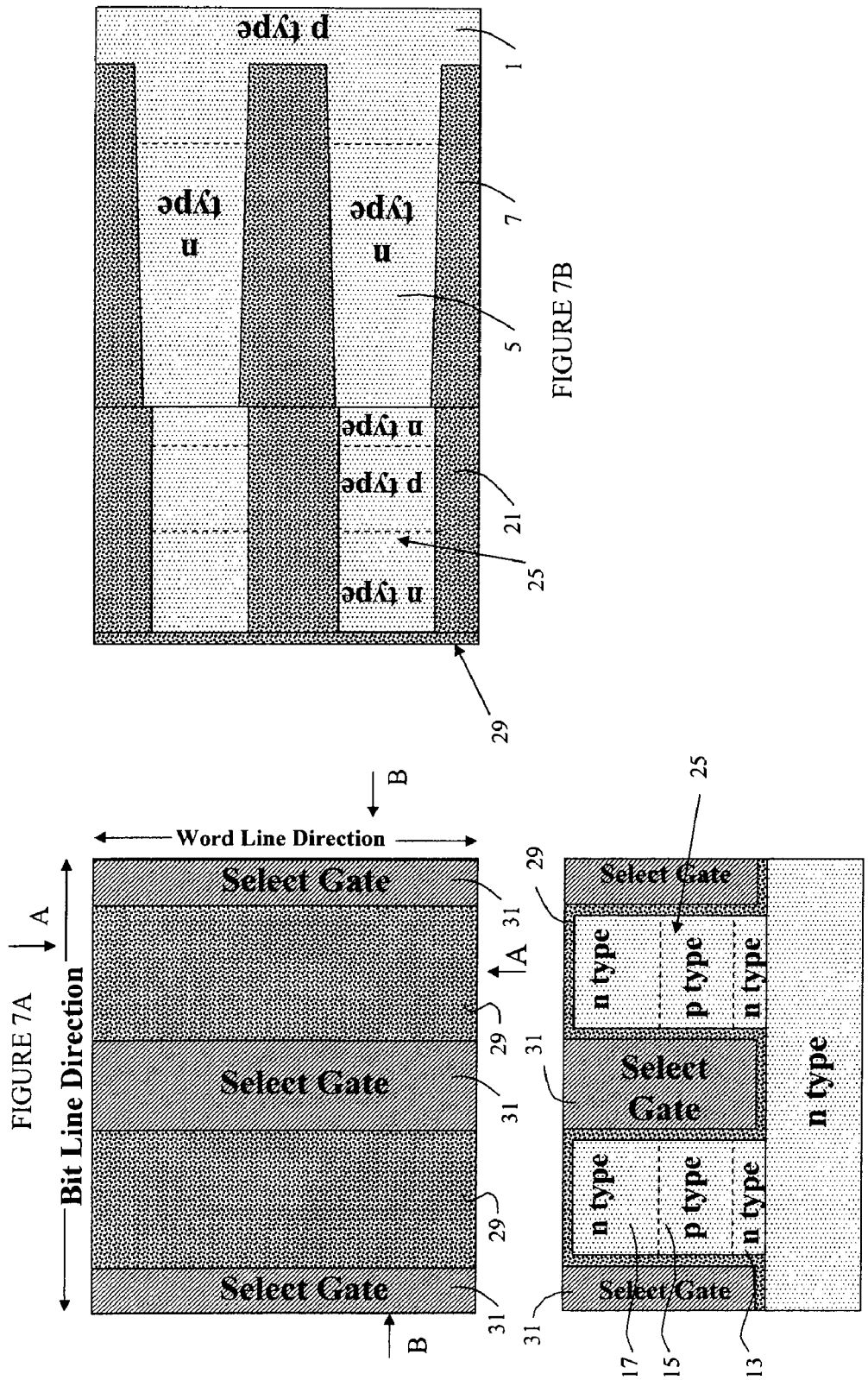

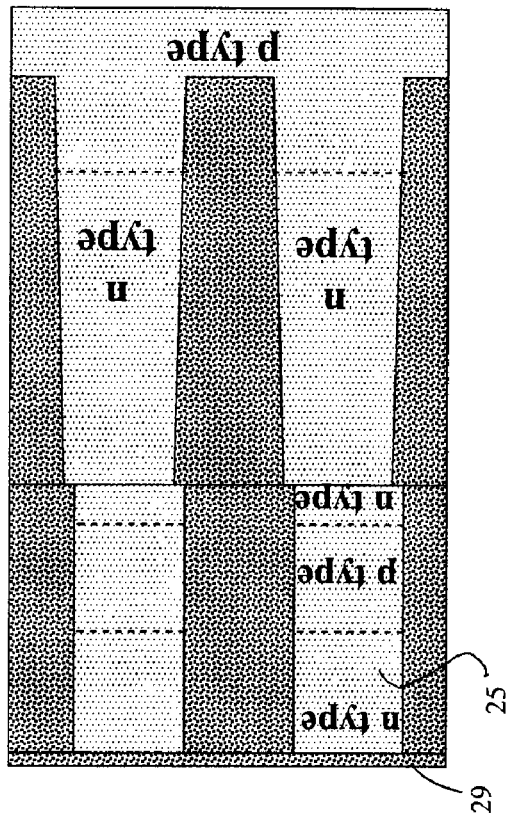
FIGURE 8B
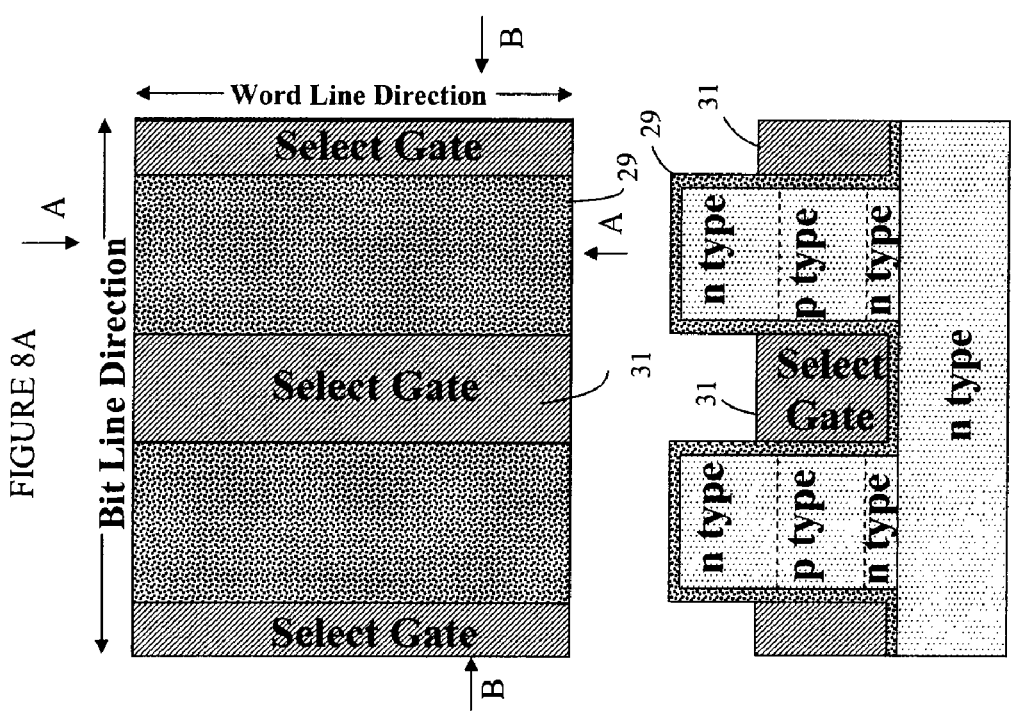
FIGURE 8A
FIGURE 8C

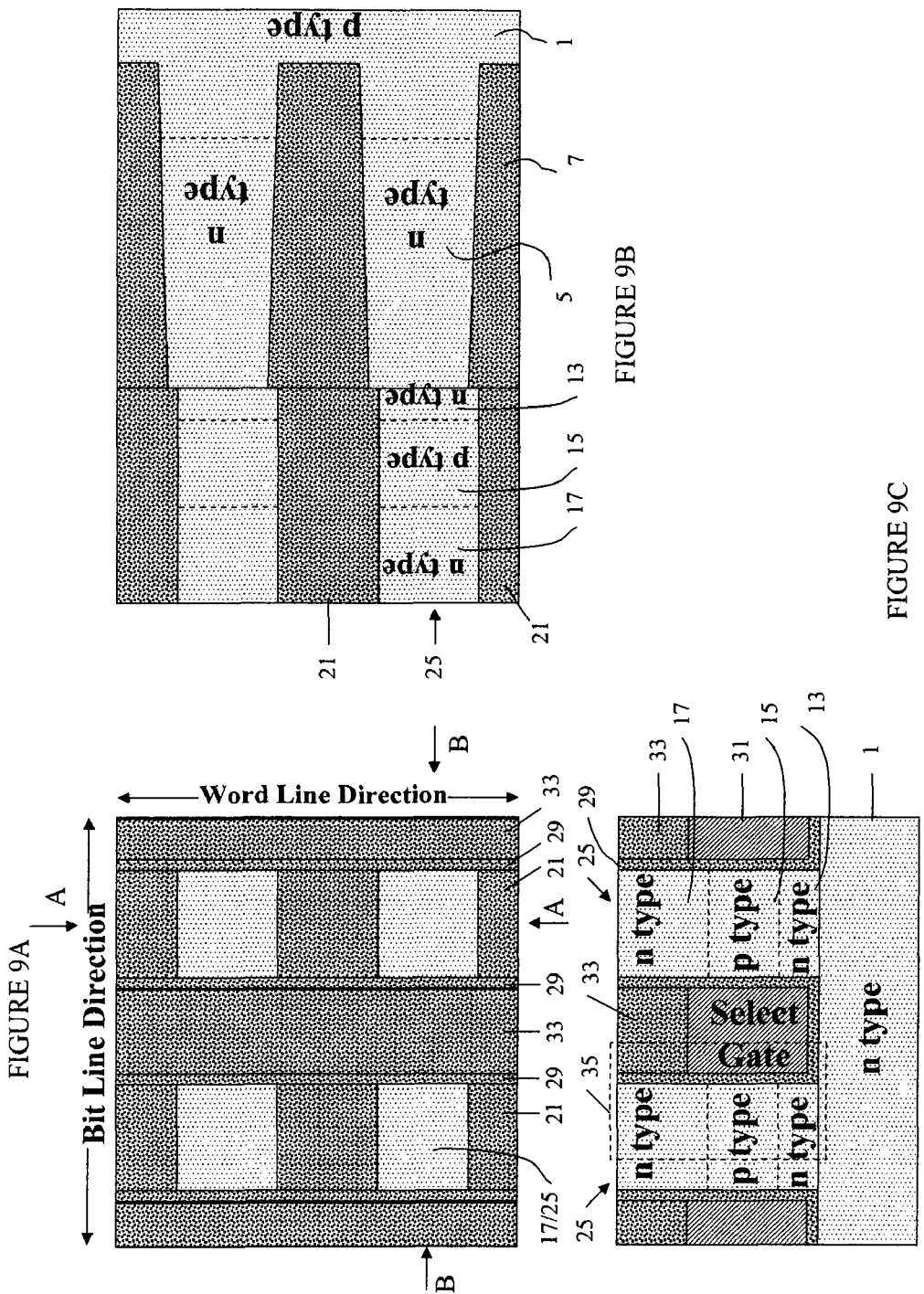

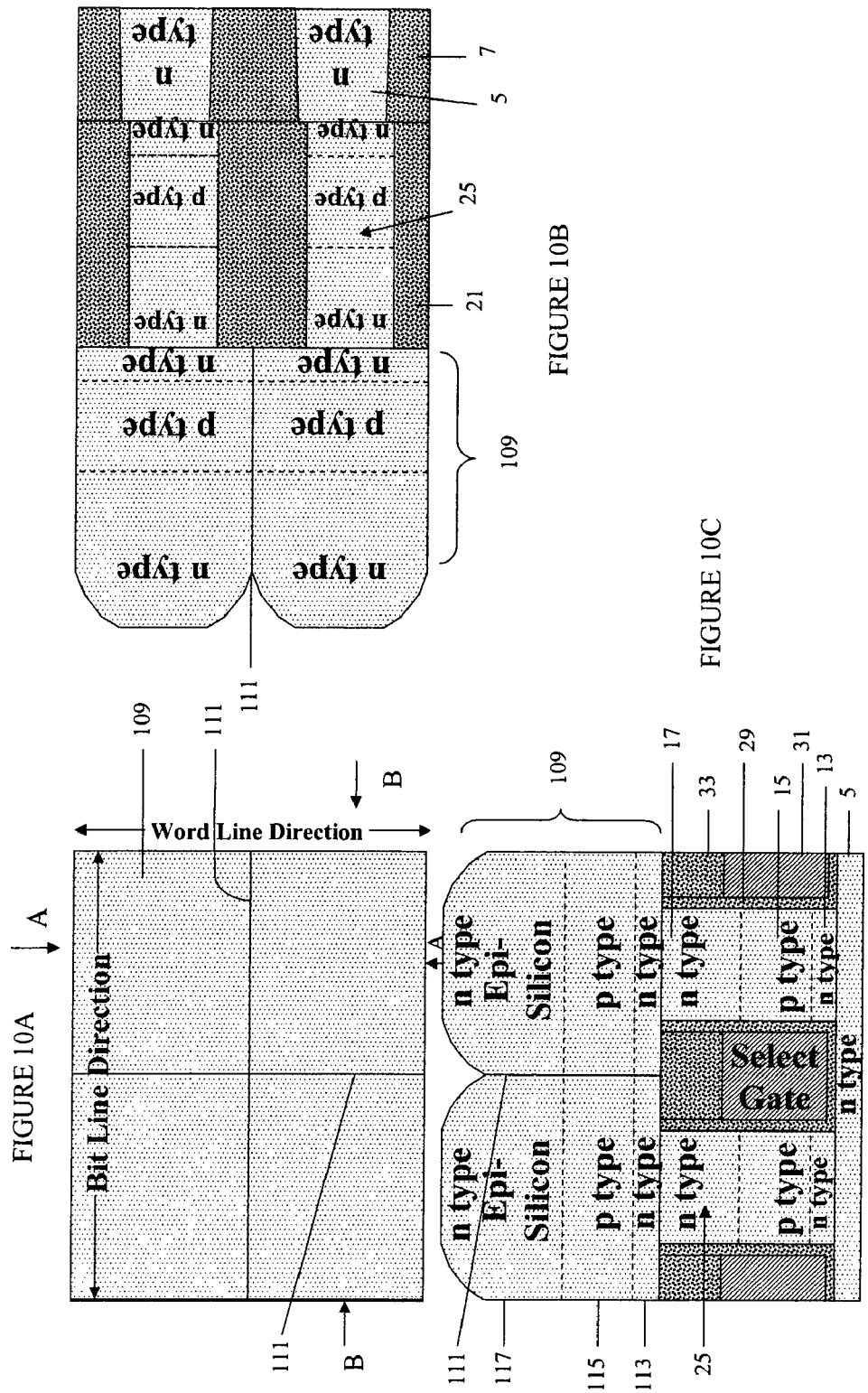

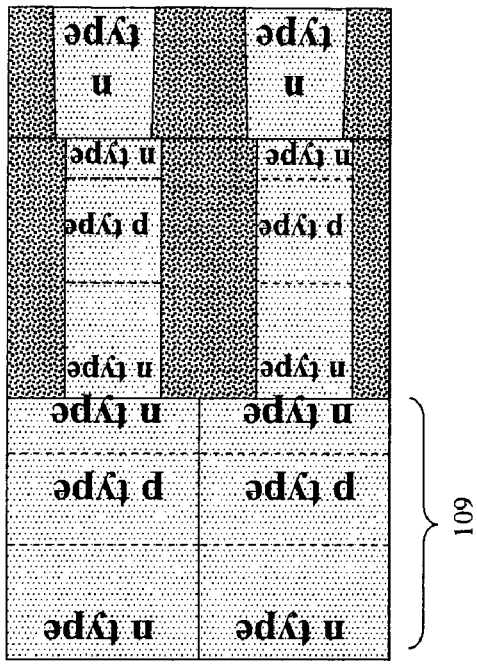
FIGURE 11B
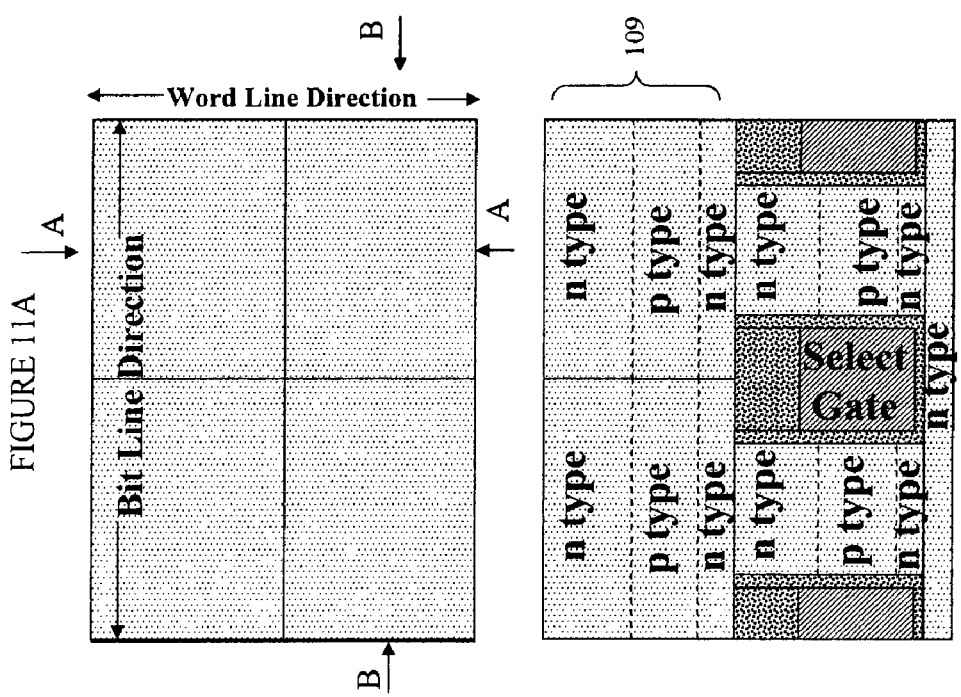
FIGURE 11C
FIGURE 11A

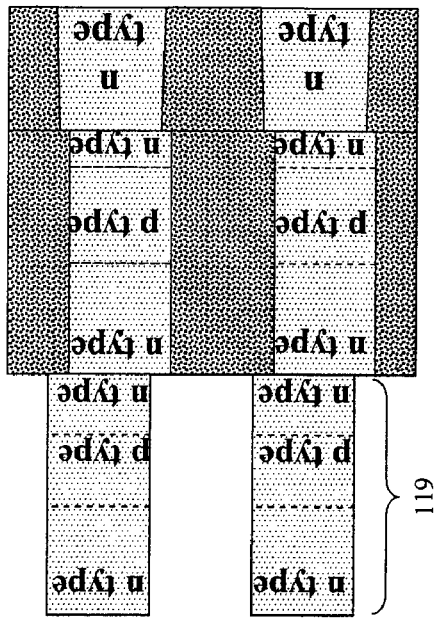
FIGURE 12B
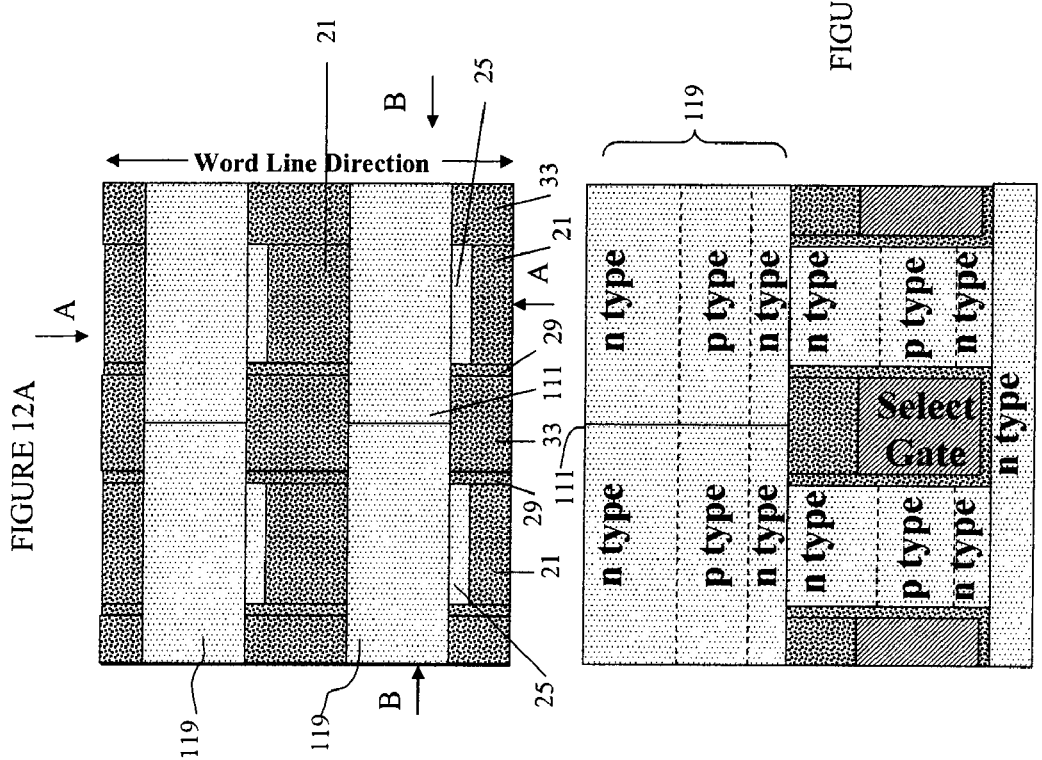
FIGURE 12A
FIGURE 12C

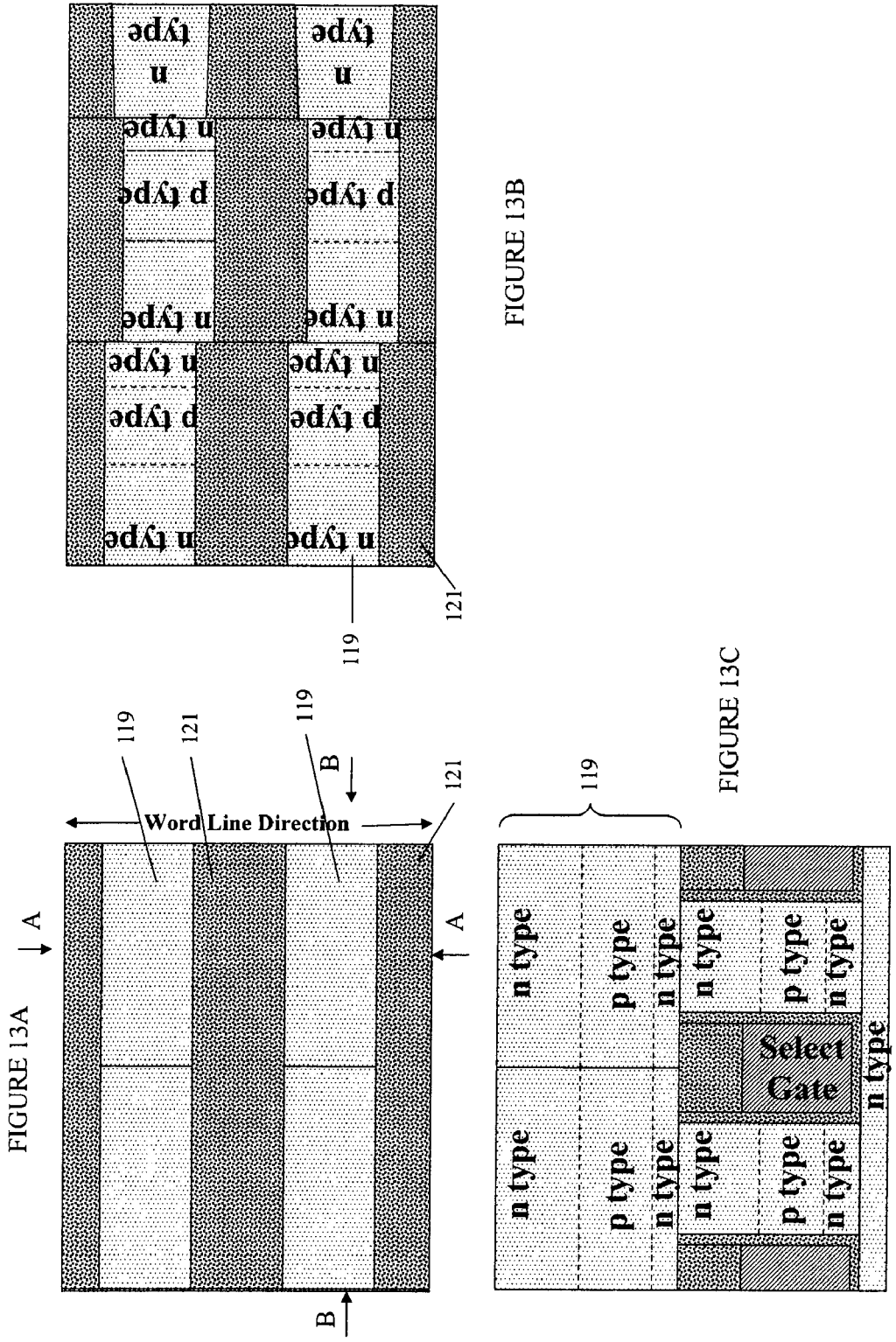

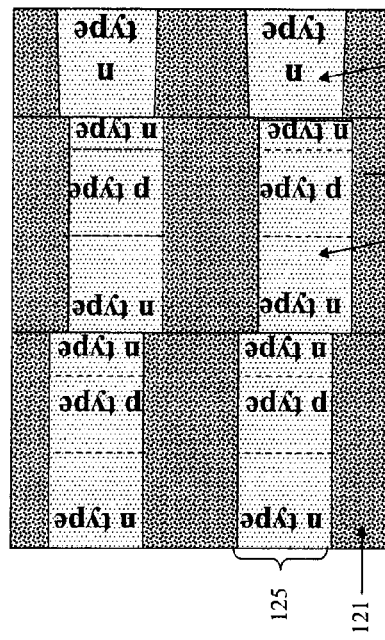
FIGURE 15B
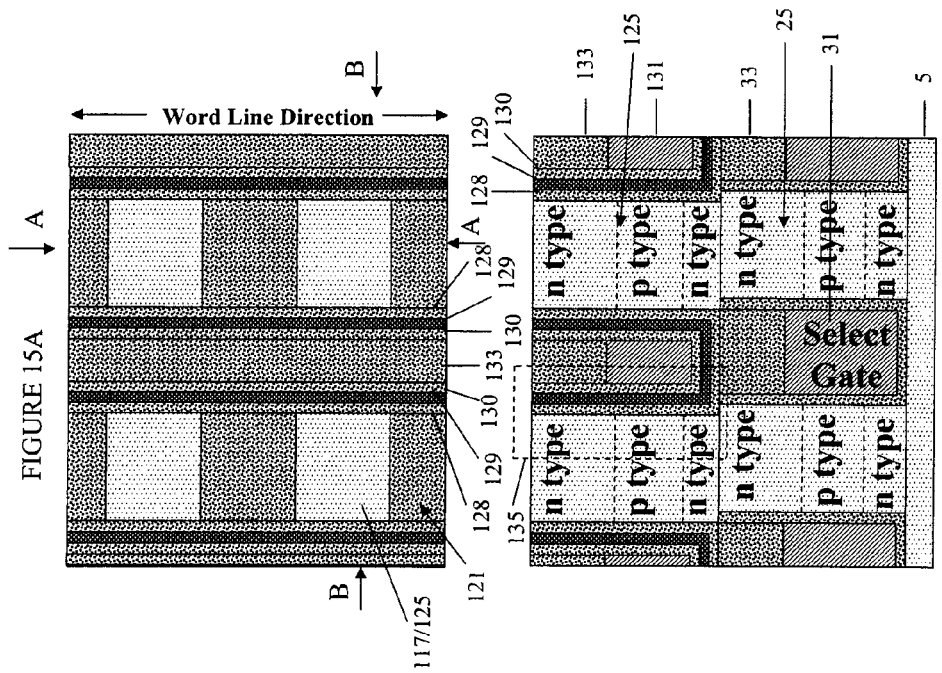
FIGURE 15A
FIGURE 15C

3D NAND memory schematic, not showing: Word Lines, Source Lines, and Select Gate Lines

THREE DIMENSIONAL NAND MEMORY

CROSS REFERENCE TO RELATED APPLICATIONS

This application is related to Mokhlesi et al., U.S. application Ser. No. 11/691,917, titled "METHOD OF MAKING THREE DIMENSIONAL NAND MEMORY", Mokhlesi et al., U.S. application Ser. No. 11/691,901, titled "THREE DIMENSIONAL NAND MEMORY", Mokhlesi et al., U.S. application Ser. No. 11/691,885, titled "METHOD OF MAKING THREE DIMENSIONAL NAND MEMORY", Mokhlesi et al., U.S. application Ser. No. 11/691,840, titled "THREE DIMENSIONAL NAND MEMORY", and Mokhlesi et al., U.S. application Ser. No. 11/691,858, titled "METHOD OF MAKING THREE DIMENSIONAL NAND MEMORY", each filed on the same day herewith, and each hereby incorporated by reference in its entirety.

BACKGROUND

The present invention relates generally to the field of semiconductor devices and specifically to three dimensional NAND strings and other three dimensional devices.

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

According to one embodiment of the invention, a monolithic, three dimensional NAND string comprises a first memory cell located over a second memory cell. A semiconductor active region of the first memory cell is formed epitaxially on a semiconductor active region of the second memory cell, such that a defined boundary exists between the semiconductor active region of the first memory cell and the semiconductor active region of the second memory cell.

According to another embodiment of the invention, a monolithic, three dimensional NAND string comprises at least a first memory cell located over a second memory cell, wherein a semiconductor active region of at least the first memory cell comprises recrystallized polysilicon.

According to another embodiment of the invention, a monolithic, three dimensional NAND string comprises at least a first memory cell located over a second memory cell, wherein at least one region of the NAND string is planarized.

BRIEF DESCRIPTION OF THE DRAWINGS

FIGS. 1A, 2A, 3A, 4A, 5A, 6A, 7A, 8A, 9A, 10A, 11A, 12A, 13A, 14A and 15A are top views of steps of making a device according to the first embodiment of the invention.

FIGS. 1B, 2B, 3B, 4B, 5B, 6B, 6C, 7B, 7C, 8B, 8C, 9B, 9C, 10B, 10C, 11B, 11C, 12B, 12C, 13B, 13C, 14B, 14C, 15B and 15C are side cross sectional views of steps of making a device according to the first embodiment of the invention. FIG. 6D is a three dimensional view of an in-process device shown in FIG. 6A.

DETAILED DESCRIPTION

Figure 1B:
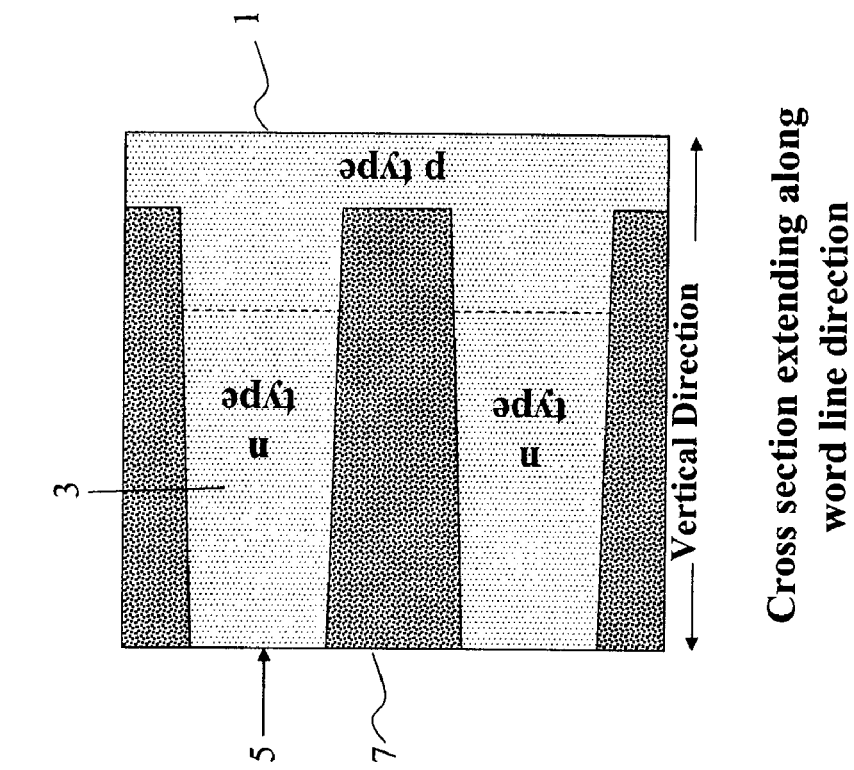

Embodiments of the present invention will be described below with reference to the accompanying drawings. It should be understood that the following description is intended to describe exemplary embodiments of the invention, and not to limit the invention.

The embodiments of the invention provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material. This nonvolatile memory preferably contains two charge trapping memory cells, such as SONOS cells, per $4F^2$ in each memory level. Therefore, a four memory cell level configuration will have $0.5F^2$ area per cell or $0.5F^2$ binary bits per cell. The array may have two or more memory cell levels, such as two to eight levels. Thus, an N memory cell level configuration will have $4F^2/2N$ area per cell. If desired, the select transistors for each NAND strings may also be monolithically integrated into each NAND string above and/or below the memory cells.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

The preferred programming and erase method of the NAND string is via Fowler-Nordheim ("FN") tunneling. Multilevel cell ("MLC") operation of the NAND string of the multiple $V_T$ states type or of the Saifon/mirror bit type is also possible.

Thus, the array contains two bits per $4F^2$ in each memory level and provides further scaling by vertically integrating multiple memory levels. Each charge trapping memory cell can be operated in a binary fashion providing large margins and high performance. Further efficiencies are provided by the fact that select transistors can also be vertically integrated and one or possibly both select transistors may be completely omitted. The vertical integration of select transistors eliminates any break in regular line and space patterning of masks used for each device level. There is no break in the continuity of regular and completely periodic lines and spaces within the entire memory array, allowing for small device features with a narrow pitch formed by lithography. In contrast to prior art two dimensional planar NAND devices, no extra space needs to be created for end of NAND string lines and spaces.

Alternative embodiments include configurations with select gates formed in trenches in the silicon wafer or other substrate, configurations with no select gate (i.e., no select gate lines and no select transistors), configurations with only select gate drain, configurations with only select gate source, and configurations with both select gates. Orientation of the select gate lines with respect to the orientation of the source lines, bit lines and word lines can be varied in various configurations. Even non-right angle orientation of various lines with respect to one another is possible, as will be described below. In some embodiments, source lines may be replaced by a common source region extending in both dimensions of the plane of the substrate and providing higher current sinking capability at the expense of inability to select individual source line voltages. The orientation of the memory levels with respect to one another can be varied also. For example, each memory level can have word lines that are oriented in perpendicular directions to the level above and to the level below.

Figure 1A:
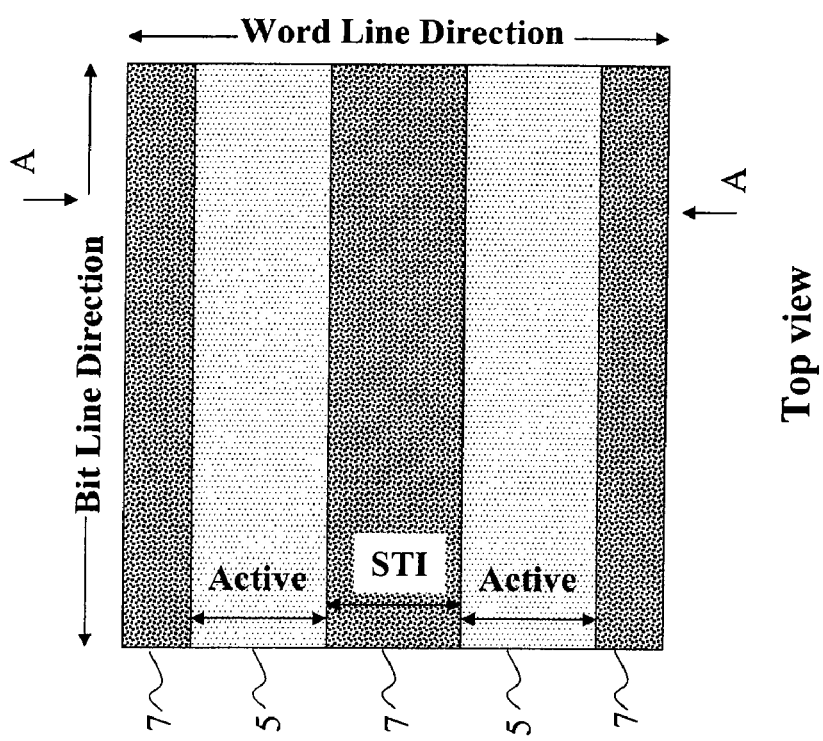

FIGS. 1A and 1B illustrate a first step in the method of making a NAND string according to a first embodiment of the invention. FIG. 1A is a top view and FIG. 1B is a side cross sectional view along line A-A in FIG. 1A which extends parallel to the word lines. FIG. 1B illustrates a p-type silicon substrate 1 containing an n-type silicon layer 3 adjacent to the surface. It should be noted that p-type and n-type regions may be reversed and that semiconductor materials other than silicon, such as gallium arsenide for example, may be used. The substrate 1 and layer 3 preferably comprise single crystal silicon. Layer 3 may be formed by a blanket ion implantation or by epitaxially growing an n-type layer on a p-type substrate. The active regions 5 in substrate 1 and layer 3 are separated from each other by insulating isolation regions 7. Any suitable isolation regions 7 may be used, such as LOCOS silicon oxide or STI oxide filled trenches. Preferably, the pn junction between substrate 1 and layer 3 is located above the bottom of the isolation regions 7, such as above the STI trench bottom, to be able to drive each active device's voltage independent of the other devices. The STI isolation regions 7 may be formed by patterning and etching standard STI trenches, performing thermal or radical liner oxidation, depositing trench fill oxide, and planarizing the fill oxide to the top of the silicon layer 3 by any suitable planarization method, such as chemical-mechanical polishing (CMP).

Figure 2B:
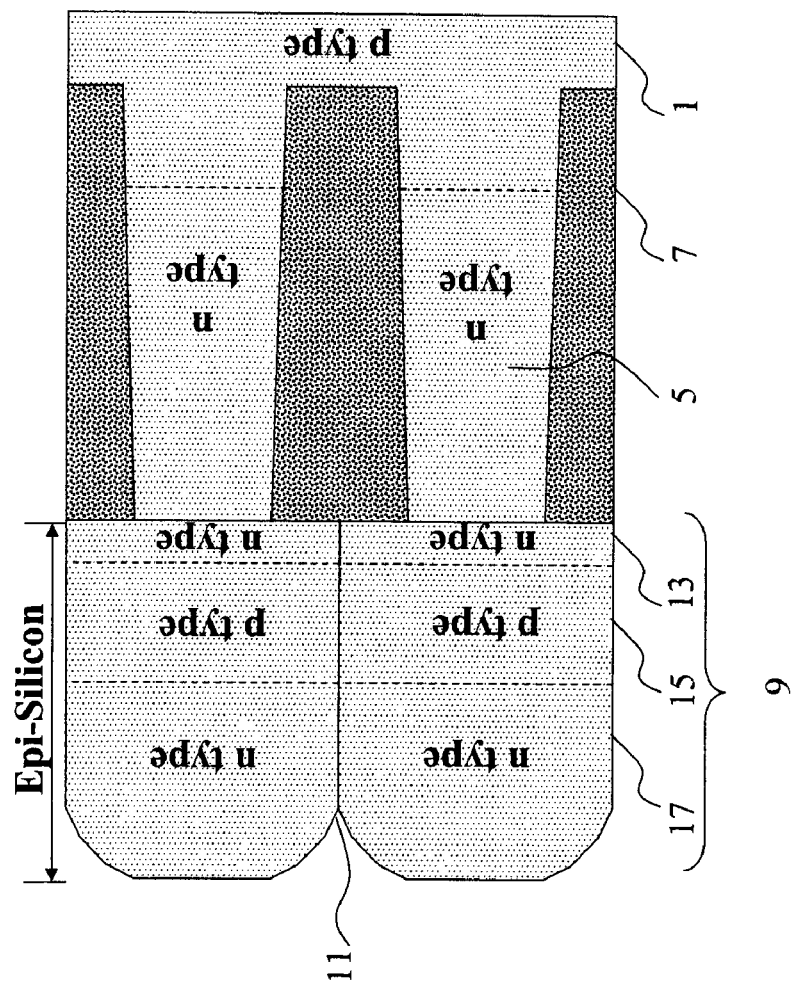
Figure 2A:
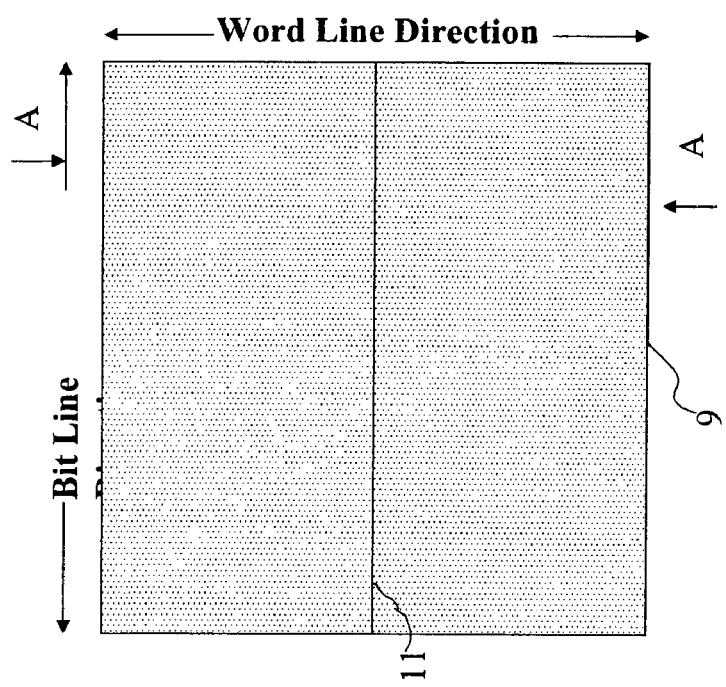

FIGS. 2A and 2B illustrate a second step in the method of making the NAND string. FIG. 2A is a top view and FIG. 2B is a side cross sectional view along line A-A in FIG. 2A which extends parallel to the word lines. As shown in FIG. 2B, a silicon layer 9 is epitaxially grown on the active regions 5 exposed between the isolation regions 7. The active regions 5 act as a seed for the epitaxial growth of layer 9. Therefore, the grain boundaries 11 in layer 9 are formed over the isolation regions 7, while essentially single crystal silicon regions in layer 9 are formed over the active regions 5.

Layer 9 contains a p-type region 15 between n-type regions 13 and 17. Layer 9 may be doped in-situ during growth by changing the dopant concentrations in the precursor gases. This forms the npn structure 13, 15, 17 that will later define source/channel/drain regions of vertical sidewall MOS select transistors. Ion implantation or other forms of doping the various layers 13-17 are also possible but result in a more complex process flow. The n-type region 13 electrically and physically contacts the n-type active regions 5 in layer 3.

Figure 3B:
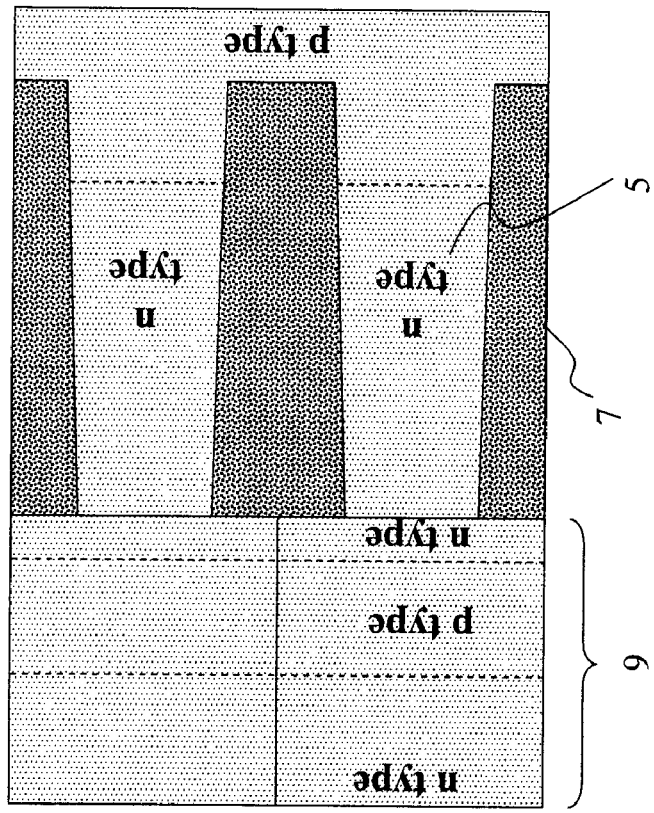
Figure 3A:
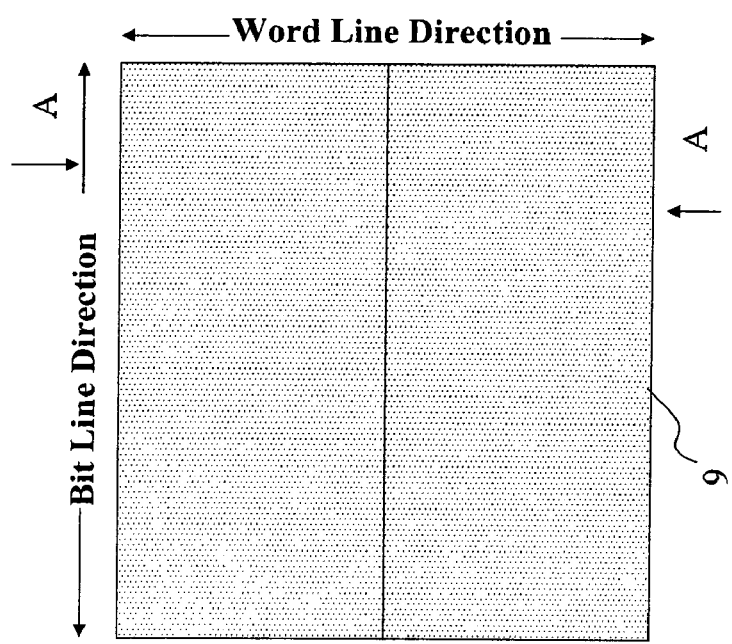

FIGS. 3A and 3B illustrate a third step in the method of making the NAND string. FIG. 3A is a top view and FIG. 3B is a side cross sectional view along line A-A in FIG. 3A which extends parallel to the word lines. As shown in FIG. 3B, the epitaxial layer 9 is planarized by any suitable planarization method, such as CMP, to provide a planar upper surface.

Figure 4B:
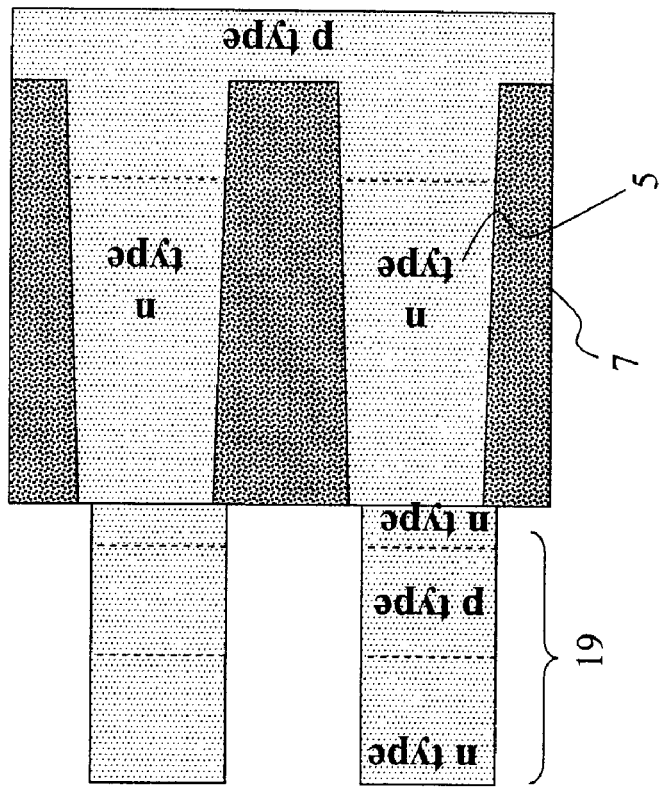
Figure 4A:
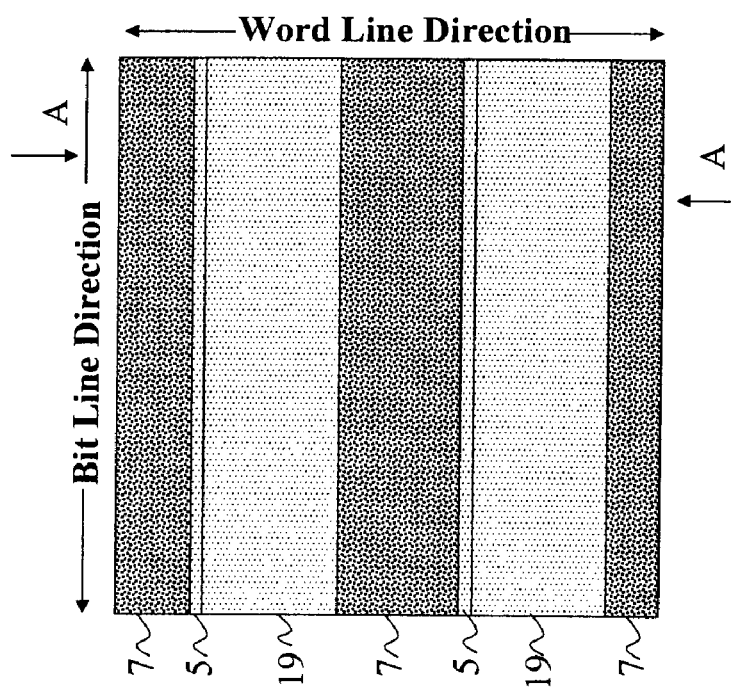

FIGS. 4A and 4B illustrate a fourth step in the method of making the NAND string. FIG. 4A is a top view and FIG. 4B is a side cross sectional view along line A-A in FIG. 4A which extends parallel to the word lines. The epitaxial layer 9 is patterned into strips 19. As used herein, the term "strip" refers to a body that has a length which is much greater than its thickness or its width and which extends in one direction along its length. The strips 19 in the first embodiment extend along the bit line direction, as will be explained in more detail below.

Figure 5B:
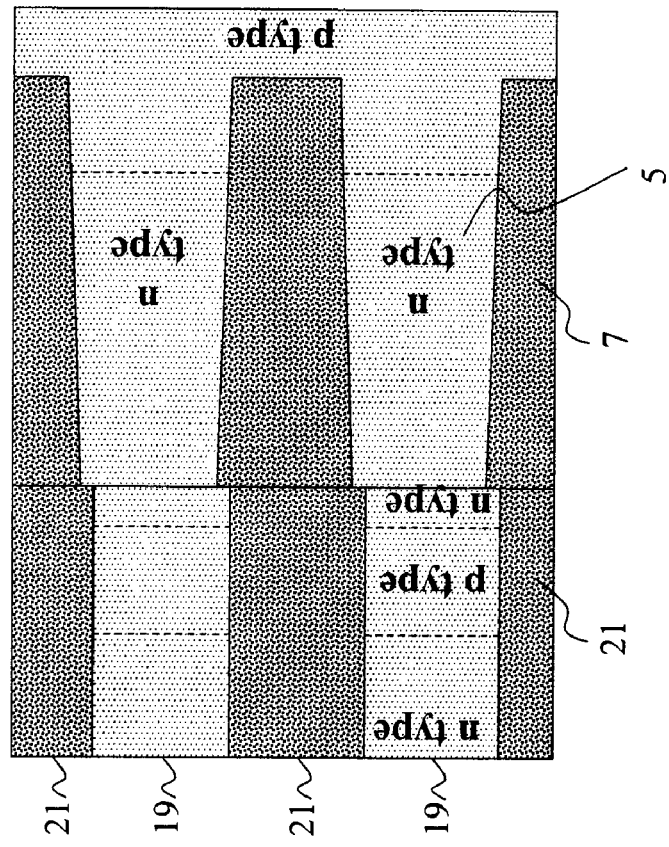
Figure 5A:
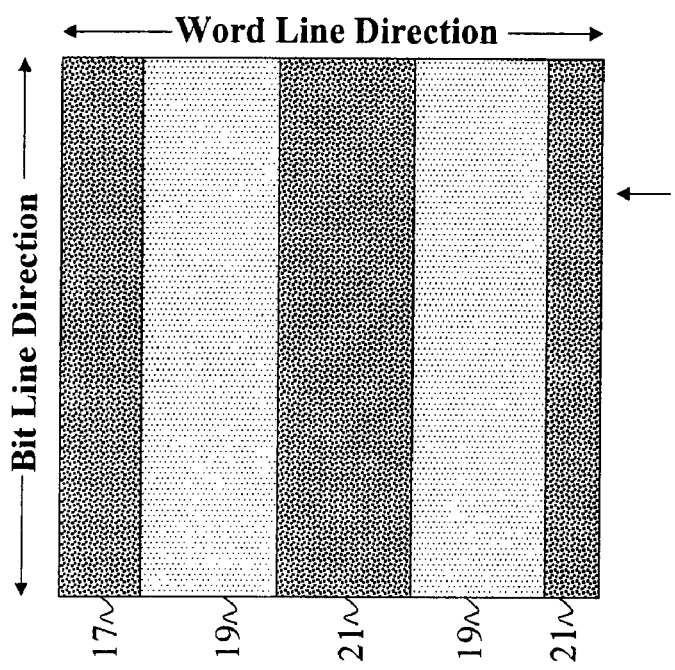

The strips 19 are formed by forming a mask over the layer 9, such as a photolithographically patterned photoresist layer mask, and etching the unmasked portions of layer 9. As shown in FIGS. 5A and 5B, the patterning of the strips is not necessarily self aligned to the active regions 5 below. Preferably, but not necessarily, the strips 19 are not aligned to the active regions 5, such that the strips 19 extend laterally past the active regions 5 and over the isolation regions 7, as shown in FIG. 5B and/or such that a portion of the active regions 5 are exposed below the strips 19, as shown in FIG. 5A.

FIGS. 5A and 5B illustrate a fifth step in the method of making the NAND string. FIG. 5A is a top view and FIG. 5B is a side cross sectional view along line A-A in FIG. 4A which extends parallel to the word lines.

As shown in FIGS. 5A and 5B, an insulating layer, such as silicon oxide and/or another insulating layer 21 is deposited between the strips and planarized with the top surface of the strips 19. The insulating layer 21 may be planarized by CMP or other planarization methods, such as etch back.

FIGS. 6A to 6D illustrate a sixth step in the method of making the NAND string. FIG. 6A is a top view and FIG. 6B is a side cross sectional view along line A-A in FIG. 6A which extends parallel to the word lines. FIG. 6C is a side cross sectional view along line B-B in FIG. 6A which extends parallel to the bit lines. FIG. 6D is a three dimensional view of the in process device shown in FIGS. 6A-6C.

The strips 19 and portions of the insulating layer 21 between the strips 19 are patterned into strips 23 which extend parallel to the word line direction and perpendicular to strips 19. The strips 23 are formed by forming a mask over the strips 19 and insulating layer 21, such as a photolithographically patterned photoresist layer mask, and etching the unmasked portions of strips 19 and layer 21.

The strips 23 consist of semiconductor pillars 25 separated from adjacent pillars in the word line direction by the portions of the insulating layer 21. Each pillar 25 is separated from adjacent pillars in the bit line direction by the trenches 27 between pillars. Each pillar 25 contains a p-type conductivity semiconductor region 15 located between n-type conductivity type semiconductor regions 13, 17 in the vertical direction (i.e., region 15 is above region 13 and below region 17 with respect to substrate 1).

Preferably, each pillar 25 has a square or rectangular cross section when viewed from the top, as shown in FIG. 6A. Thus, each pillar 25 preferably has four vertical sides.

FIGS. 7A to 7C illustrate a seventh step in the method of making the NAND string. FIG. 7A is a top view and FIG. 7B is a side cross sectional view along line A-A in FIG. 7A which extends parallel to the word lines. FIG. 7C is a side cross sectional view along line B-B in FIG. 7A which extends parallel to the bit lines.

As shown in FIG. 7C, a gate insulating layer 29 is formed in the trenches 27 between the pillars 25 and over the top surfaces of the pillars 25. The gate insulating layer 29 may comprise silicon oxide, silicon nitride or any other suitable gate insulating layer material. If desired, layer 29 may contain two or more sublayers having a different composition.

A select gate layer is then deposited over the gate insulating layer 29. One or more of any suitable gate electrode materials may be used for the select gate layer, such as polysilicon, silicide (titanium silicide, etc.), tungsten, aluminum or a combination of sublayers of these materials.

The select gate layer is then planarized with the top of the gate insulating layer 29 by any suitable planarization method, such as CMP. The planarization leaves the select gates 31 located in portions of the trenches 27 above the gate insulating layer 29, as shown in FIG. 7C.

FIGS. 8A to 8C illustrate an eighth step in the method of making the NAND string. FIG. 8A is a top view and FIG. 8B is a side cross sectional view along line A-A in FIG. 8A which extends parallel to the word lines. FIG. 8C is a side cross sectional view along line B-B in FIG. 8A which extends parallel to the bit lines.

As shown in FIG. 8C, the select gates 31 are partially etched back so that the top of the select gates are located below the tops of the pillars 25. The gates 31 may be etched back using a selective etch which etches the gate material selectively over the gate insulating layer 29 material.

FIGS. 9A to 9C illustrate a ninth step in the method of making the NAND string. FIG. 9A is a top view and FIG. 9B is a side cross sectional view along line A-A in FIG. 9A which extends parallel to the word lines. FIG. 9C is a side cross sectional view along line B-B in FIG. 9A which extends parallel to the bit lines.

An insulating cap layer is deposited over the recessed select gates 31 and over the gate insulating layer 29. Preferably, the cap layer comprises the same material as the gate insulating layer 29, such as silicon oxide. The cap layer is then planarized, such as CMP planarized, to fill the trenches located above the select gates 31 and to form insulating caps 33 located above each select gate 31. The cap 33 electrically isolates the select gates from the NAND string memory cells that will be formed above. During the planarization of the cap layer, the portions of the gate insulating layer 29 located above the semiconductor pillars 25 are also removed to expose the top region 17 of the pillars 25.

As shown in FIG. 9A, the select gates 31 comprise portions of select gate lines which extend in the word line direction. Thus, the select gate lines comprise strip shaped lines located in trenches 27 (which were shown in FIG. 6A). Each select gate 31 acts as a gate electrode for two adjacent select transistors 35 to the left and right of the gate 31 in FIG. 7C.

Thus, the ninth step completes the bottom select transistor 35 for the NAND string. Each select field effect transistor 35 comprises the pillar 25 active region, in which region 15 acts as a channel and regions 13 and 17 as "source" and "drain" regions, a select gate 31 which acts as the gate electrode of the transistor, and the gate insulating layer 29 located between the select gate 31 and the pillar 25. Since each pillar 25 is located between two different select gates 31, the left and right side of each pillar 25 can be considered as a separate select transistor 35 for the same NAND string to be formed above the pillar 25.

FIGS. 10A to 10C illustrate a tenth step in the method of making the NAND string. FIG. 10A is a top view and FIG. 10B is a side cross sectional view along line A-A in FIG. 10A which extends parallel to the word lines. FIG. 10C is a side cross sectional view along line B-B in FIG. 10A which extends parallel to the bit lines.

FIGS. 10A-10C illustrate the first step in the formation of the memory cells above the select transistors 35. First, the silicon surface of the exposed pillars 25 is preferably cleaned after the CMP step in FIG. 9C. For example, the top surface of each silicon pillar may be treated by thermal or radical oxidation (i.e., to form a silicon oxide layer on the top of the pillars) followed by a wet, gentle oxide etch in order to remove the oxide layer along with the damage incurred during CMP and/or dry etches, to prepare the silicon surface for the growth of next epitaxial layer. Such damage may impact quality of the subsequent epitaxial layer growth.

Then, as shown in FIGS. 10A-10C, the next epitaxial layer 109 is grown on the completed select gate transistors 35. The subsequent steps of forming the first NAND memory cell are similar to the method steps shown in FIGS. 2-9, except that a charge storage region is formed instead of a gate insulating layer 29.

As shown in FIGS. 10B and 10C, the silicon layer 109 is epitxially grown on the pillar active regions 25 exposed between the isolation regions formed by insulating layers 21, 29 and 33. For example, plasma assisted epitaxy (i.e., PECVD) may be used to grow the silicon layer 109 at lower temperatures, such as at 700° C. and below, for example at around 650° C. While higher temperature growth processes may be used, the low temperature PECVD process allows the use of lower thermal budget metals and dielectrics (i.e., metals and dielectrics that cannot withstand temperatures above 700° C.) and provide for more controlled junction depths and channel lengths.

The exposed box shape upper surface of pillar active regions 25 act as a seed for the epitaxial growth of layer 109. Therefore, the grain boundaries 111 in layer 109 are formed over the isolation regions, while essentially single crystal silicon regions in layer 109 are formed over the active regions 25. The grain growth of layer 109 mushrooms out from the seeds 25 below and forms grain boundaries 111 where the grains meet each other during the epitaxy process. Thus, the position of the grain boundaries 111 will be where random grains meet and the grain boundaries 111 will generally not be as smooth and predictable as schematically illustrated in FIGS. 10A-10C. However, the grain boundaries are located in regions that will be etched away during subsequent steps. Thus, a high level of smoothness and predictability is not required.

Layer 109 contains a p-type region 115 located between n-type regions 113 and 117 in the vertical direction. Layer 109 may be doped in-situ during growth by changing the dopant concentrations in the precursor gases. This forms the npn structure 113, 115, 117 that will later define source/channel/drain regions of charge trapping MOS memory devices (i.e., the NAND memory cells). Ion implantation or other forms of doping the various layers 113-117 are also possible but result in a more complex process flow. The n-type regions 113 electrically and physically contact the n-type active regions 17 in pillar 25.

FIGS. 11A to 11C illustrate an eleventh step in the method of making the NAND string. FIG. 11A is a top view and FIG. 11B is a side cross sectional view along line A-A in FIG. 11A which extends parallel to the word lines. FIG. 11C is a side cross sectional view along line B-B in FIG. 11A which extends parallel to the bit lines.

As shown in FIGS. 11B and 11C, the epitaxial layer 109 is planarized by any suitable planarization method, such as CMP, to provide a planar upper surface.

FIGS. 12A to 12C illustrate a twelfth step in the method of making the NAND string. FIG. 12A is a top view and FIG. 12B is a side cross sectional view along line A-A in FIG. 12A which extends parallel to the word lines. FIG. 12C is a side cross sectional view along line B-B in FIG. 12A which extends parallel to the bit lines.

The epitaxial layer 109 is patterned into strips 119. As used herein, the term "strip" refers to a body that has a length which is much greater than its thickness or its width and which extends in one direction along its length. The strips 119 in the first embodiment extend along the bit line direction, as will be explained in more detail below.

The strips 119 are formed by forming a mask over the layer 109, such as a photolithographically patterned photoresist layer mask, and etching the unmasked portions of layer 109. As shown in FIGS. 12A-12C, the patterning of the strips is not necessarily self aligned to the pillar active regions 25 below. Preferably, but not necessarily, the strips 119 are not aligned to the active regions 25, such that the strips 119 extend laterally past the active regions 25 and over the isolation regions formed by layers 21, 29 and 33 which surround the pillars 25, as shown in FIGS. 12B and 12C and/or such that a portion of the active regions 25 are exposed below the strips 119, as shown in FIG. 12A.

FIGS. 13A to 13C illustrate a thirteenth step in the method of making the NAND string. FIG. 13A is a top view and FIG. 13B is a side cross sectional view along line A-A in FIG. 13A which extends parallel to the word lines. FIG. 13C is a side cross sectional view along line B-B in FIG. 13A which extends parallel to the bit lines.

As shown in FIGS. 13A-13B, an insulating layer, such as silicon oxide and/or another insulating layer 121 is deposited between the strips 119 adjacent to exposed lateral sides of the strips 119. Layer 121 is then planarized with the top surface of the strips 119. The insulating layer 121 may be planarized by CMP or other planarization methods, such as etch back.

Figures 14A, 14B, 14C:
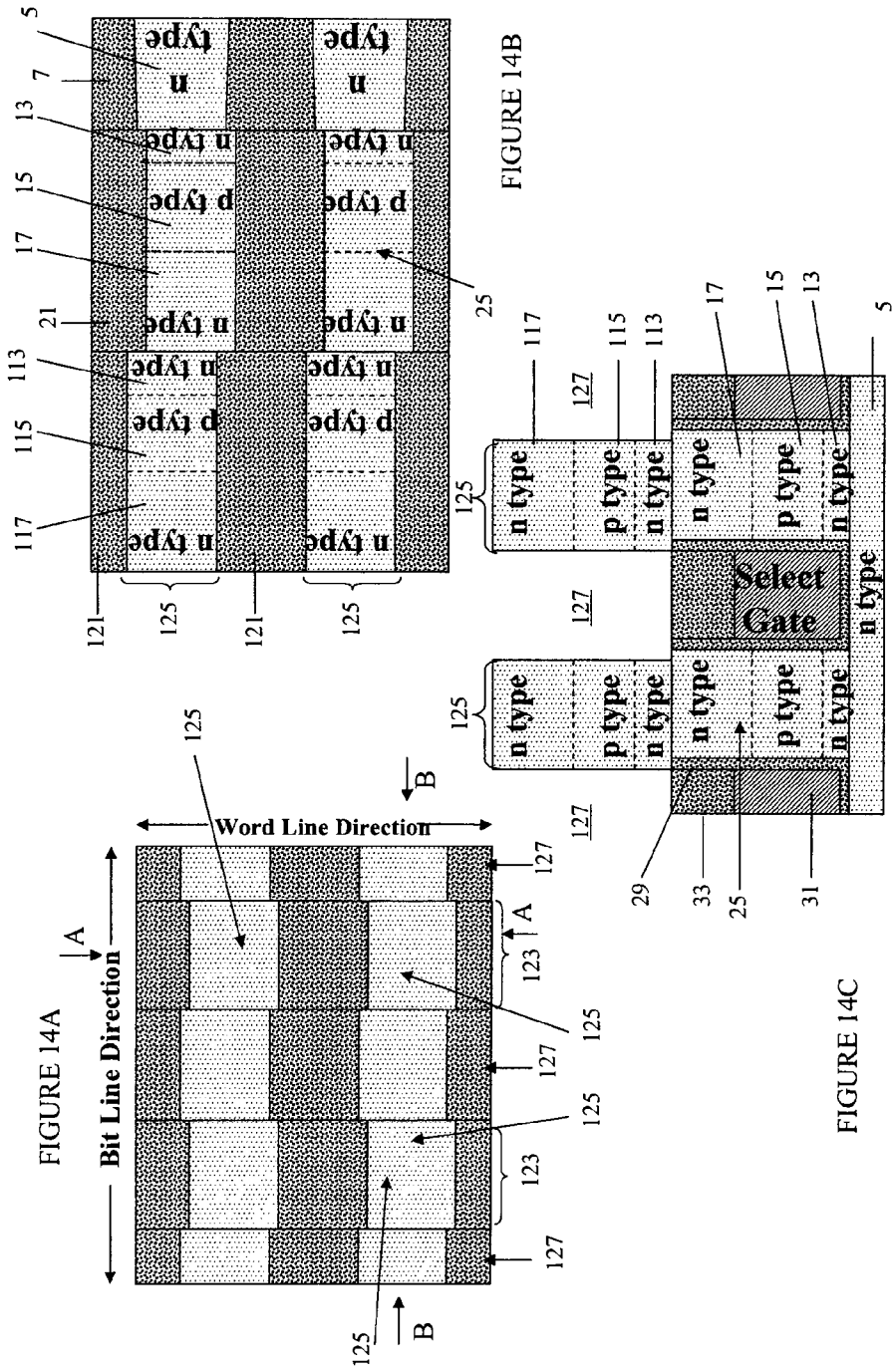

FIGS. 14A to 14C illustrate a fourteenth step in the method of making the NAND string. FIG. 14A is a top view and FIG. 14B is a side cross sectional view along line A-A in FIG. 14A which extends parallel to the word lines. FIG. 14C is a side cross sectional view along line B-B in FIG. 14A which extends parallel to the bit lines The strips 119 and portions of the insulating layer 121 between the strips 119 are patterned into strips 123 which extend parallel to the word line direction and perpendicular to strips 119. The strips 123 are formed by forming a mask over the strips 119 and insulating layer 121, such as a photolithographically patterned photoresist layer mask, and etching the unmasked portions of strips 119 and layer 121.

The strips 123 consist of semiconductor pillars 125 separated from adjacent pillars in the word line direction by the portions of the insulating layer 121. Each pillar 125 is separated from adjacent pillars in the bit line direction by the trenches 127 between pillars. Each pillar 125 contains a p-type conductivity semiconductor region 115 located between n-type conductivity type semiconductor regions 113, 117 in the vertical direction (i.e., region 115 is above region 113 and below region 117 with respect to substrate 1).

Preferably, each pillar 125 has a square or rectangular cross section when viewed from the top, as shown in FIG. 14A. Thus, each pillar 125 preferably has four vertical sides.

FIGS. 15A to 15C illustrate a fifteenth step in the method of making the NAND string. FIG. 15A is a top view and FIG. 15B is a side cross sectional view along line A-A in FIG. 15A which extends parallel to the word lines. FIG. 15C is a side cross sectional view along line B-B in FIG. 15A which extends parallel to the bit lines.

As shown in FIGS. 15A-15C, a charge storage region is formed between the strips 123. The charge storage region may comprise a dielectric isolated floating gate or a dielectric charge storage material. For example, to form a dielectric isolated floating gate, a polysilicon layer is deposited between two insulating layers, such as silicon oxide tunneling and blocking layers. For example, sidewall spacer formed floating gates may be used. The additional space taken by spacer floating gate may be recouped by utilizing multilevel cell (MLC) programming for these devices.

To form a dielectric charge storage region, a charge storage dielectric layer is deposited between tunneling and blocking dielectric (i.e., insulating) layers. For example, the charge storage dielectric layer may comprise a silicon nitride layer while the tunneling and blocking layers may comprise silicon oxide layers to form an "ONO" charge storage region of a "SONOS" type device. Preferably, the tunneling dielectric layer is thinner than the blocking dielectric layer.

However, materials other than silicon nitride and silicon oxide may be used instead. For example, TANOS type devices may be used. As disclosed in U.S. Pat. No. 6,858,899, which is incorporated herein by reference in its entirety, high dielectric constant insulating materials, such as materials having a dielectric constant of above 3.9, may be used for the tunneling and/or the blocking dielectric layer instead of silicon oxide. These materials include metal oxide layers, such as aluminum oxide, tantalum oxide, yttrium oxide, calcium oxide, magnesium oxide or zirconium oxide. The charge storage dielectric may alternatively comprise a silicon oxynitride layer in which a portion of nitrogen in the silicon nitride layer is substituted with oxygen. Alternatively, a metal oxide layer, such as tantalum oxide, zirconium oxide or hafnium oxide, may be used as the charge storage dielectric.

In the following discussion, the ONO charge storage region will be described. However, it should be understood that a floating gate charge storage region or other dielectric charge storage material combinations may be used instead.

As shown in FIGS. 15A and 15C, a tunneling dielectric layer 128, a charge storage dielectric layer 129 and a blocking dielectric layer 130 are formed in that order in the trenches 127 between the pillars 125 (i.e., adjacent to exposed sides of the pillars) and over the top surfaces of the pillars 125. The tunneling and blocking dielectrics may comprise silicon oxide while the charge storage dielectric may comprise silicon nitride.

A control gate layer is then deposited over the dielectric layers 128-130. One or more of any suitable gate electrode materials may be used for the control gate layer, such as polysilicon, silicide (titanium silicide, etc.), tungsten, aluminum or a combination of sublayers of these materials.

The control gate layer is then planarized with the top of the tunneling layer 128 by any suitable planarization method, such as CMP. The planarization leaves control gates 131 located in portions of the trenches 127 above the dielectric layers 128-130.

The control gates 131 are partially etched back so that the top of the gates are located below the tops of the pillars 125. The gates 131 may be etched back using a selective etch which etches the gate material selectively over the ONO dielectric layers 128-130.

An insulating cap layer is then deposited over the recessed control gates 131 and over the ONO dielectrics. Preferably, the cap layer comprises the same material as the blocking dielectric 130, such as silicon oxide. The cap layer is then planarized, such as CMP planarized, to fill the trenches located above the control gates 131 and to form insulating caps 133 located above each control gate 131. The cap 133 electrically isolates the control gates from additional NAND string memory cells that will be formed above. During the planarization of the cap layer, the portions of the ONO dielectric layers 128-130 located above the semiconductor pillars 125 are also removed to expose the top region 117 of the pillars 125.

As shown in FIG. 15A, the control gates 131 comprise portions of word lines which extend below the caps 133 in the word line direction. Thus, the word gate lines comprise strip shaped lines located in trenches 127. Each control gate 131 acts as a gate electrode for two adjacent memory cells 135 to the left and right of the gate 131 in FIG. 15C.

This completes the bottom memory cell 135 for the NAND string. Each memory cell 135 comprises the pillar 125 active region, in which region 115 acts as a channel and regions 113 and 117 as "source" and "drain" regions, a control gate/word line 131 which acts as the gate electrode of the transistor, and the charge storage region, such as the ONO dielectric layers 128-130 located between the control gate 131 and the pillar 125. Since each pillar 125 is located between two different control gates 131, the left and right side of each pillar 125 can be considered as a memory cell.

Figure 16:
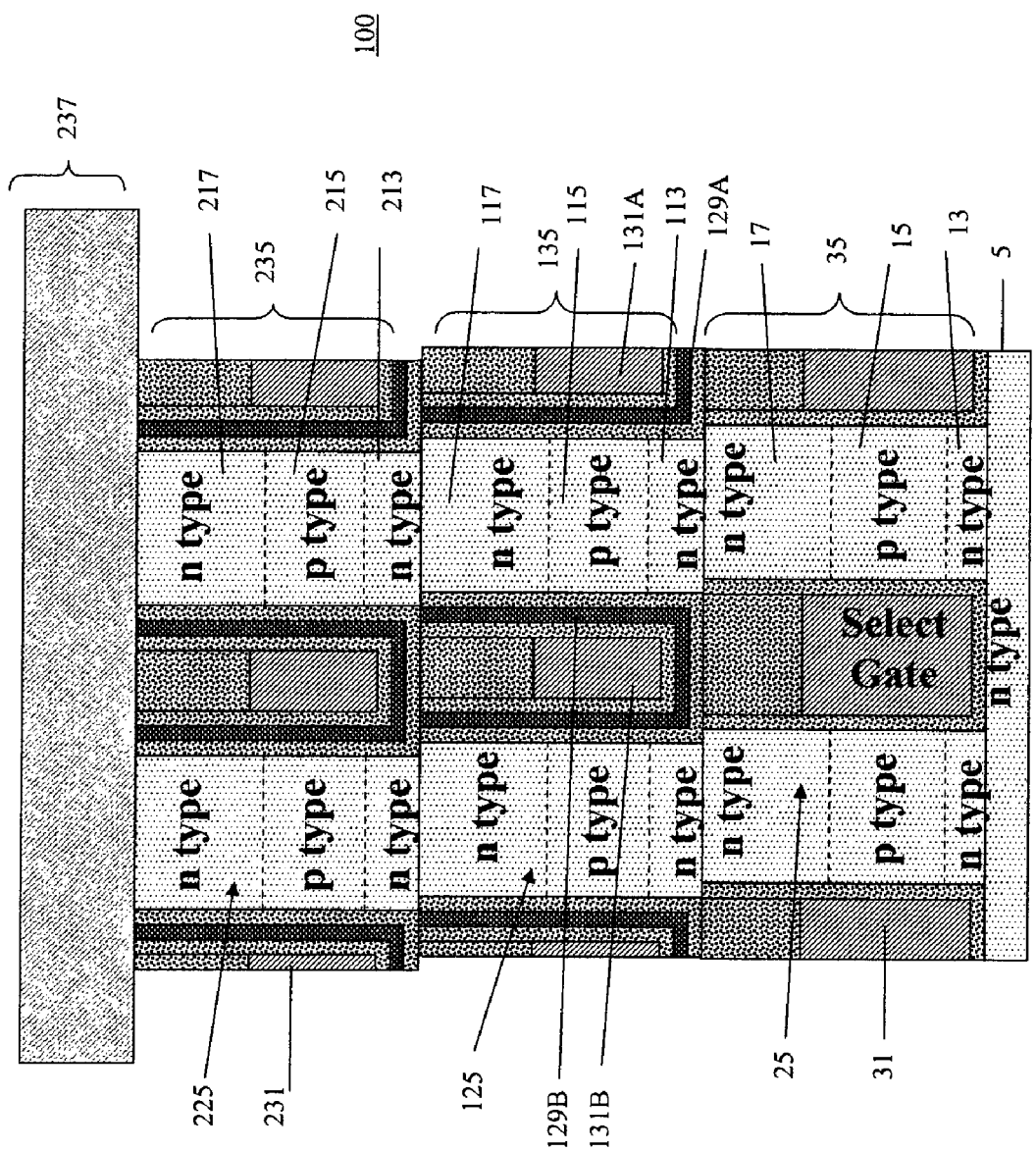
FIG. 16 illustrates a side cross sectional view along the bit line direction of a completed vertical NAND string of the first embodiment of the invention.

FIG. 16 illustrates a side cross sectional view along the bit line direction of a completed vertical NAND string. A second level of memory cells 235 which are identical to the first memory cells 135 is formed on the first memory cells 135 by repeating the process steps described above with respect to FIGS. 10-15 to form a multilevel vertical NAND string. If desired, additional levels of memory cells, such as two to six levels of memory cells may be formed over the first level of memory cells 135 by repeating the process steps described above. A plurality of bit lines 137 are then formed above the upper most level of memory cells. The bit lines 137 contacts the pillar active regions of the upper level of memory cells. For example, the single bit line 137 shown in FIG. 16 extends perpendicular to the word lines 131, 231 of the memory cells. However, the bit lines 137 may extend in other directions as will be described in more detail below.

Furthermore, if desired, an upper select transistor may be above the upper level of the memory cells below the bit lines 137 using the same method as the lower select gate transistor 35. The upper select gate transistor is formed in addition to or instead of the lower select gate transistor 35.

Thus, FIG. 16 illustrates the vertical NAND string 100 which is formed vertically over the substrate. One memory cell 235 is located in an upper device level and another memory cell 135 is located in a lower device level located over the substrate and below the first device level 235. Since active regions 125 and 225 are grown in different epitaxial growth steps, a defined boundary exists between the semiconductor active regions 125 and 225. The boundary may comprise a dislocation, a grain boundary or a lateral offset of the pillar 225 with respect to pillar 125 at the boundary. In contrast, the prior art vertical NAND string described in T. Endoh, et. al., titled "Novel Ultra High Density Memory With A Stacked-Surrounding Gate Transistor (S-SGT) Structured Cell", IEDM Proc. (2001) 33-36 is formed by plural etching steps of the same region of the substrate.

Furthermore, the pillar shaped active regions of the vertical NAND string memory cells made by the method described above have a square or rectangular cross section when it is viewed from the top. This provides separate faces for each word line in each cell and allows the two bit per cell configuration. The pillar shaped active regions are formed by patterning the active layer into strips and then patterning the strips into pillars. In contrast, the active regions of Endoh et al. have a circular cross section when viewed from the top. The active regions are surrounded by a surround gate for a one bit per cell configuration.

The semiconductor active region 25 of the select transistor 35 comprises a pillar. The semiconductor active region 125 of the lower memory cell comprises a pillar which is not aligned with the semiconductor active region 25 of the select transistor 35. In the non-limiting embodiment shown in FIG. 16, the active region 125 extends laterally in at least one direction past the semiconductor active region 25 of the select transistor 35. Likewise, the pillar active region 225 extends laterally in at least one direction past the pillar active region 125 of cell 135, such that the pillar 125 is not aligned with the pillar 225.

The semiconductor active region of the memory cell 135 is a pillar 125 comprising a first conductivity type semiconductor region 115 located between second conductivity type semiconductor regions 113, 117. The semiconductor active region of memory cell 235 is a pillar 225 comprising a first conductivity type semiconductor region 215 located between second conductivity type semiconductor regions 213, 217. The second conductivity type semiconductor region 213 in pillar 225 contacts second conductivity type semiconductor region 117 in pillar 125.

As shown in FIG. 16, in the lower memory cell 135, a first charge storage dielectric 129A is located adjacent to one side of the first conductivity type semiconductor region 115 in the pillar 125 and a first control gate 131A is located adjacent to the first charge storage dielectric 129A. A second charge storage dielectric 129B is located adjacent to the opposite side of first conductivity type semiconductor region 115 in the pillar 125, and a second control gate 131B is located adjacent to the second charge storage dielectric 129B. A similar configuration is present in the upper memory cell 235, where the two charge storage dielectrics and two control gates are located on opposite sides of region 215 in pillar 225.

Figure 17A:
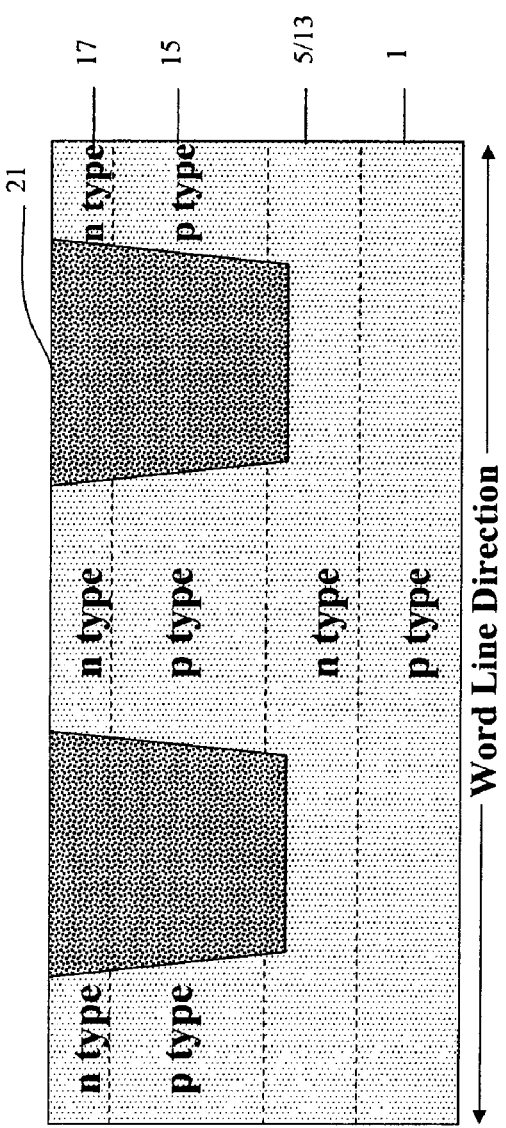
FIGS. 17A and 17B illustrate side cross sectional views of portions of the access transistor of NAND string according to second and third embodiments of the invention.
Figure 17B:
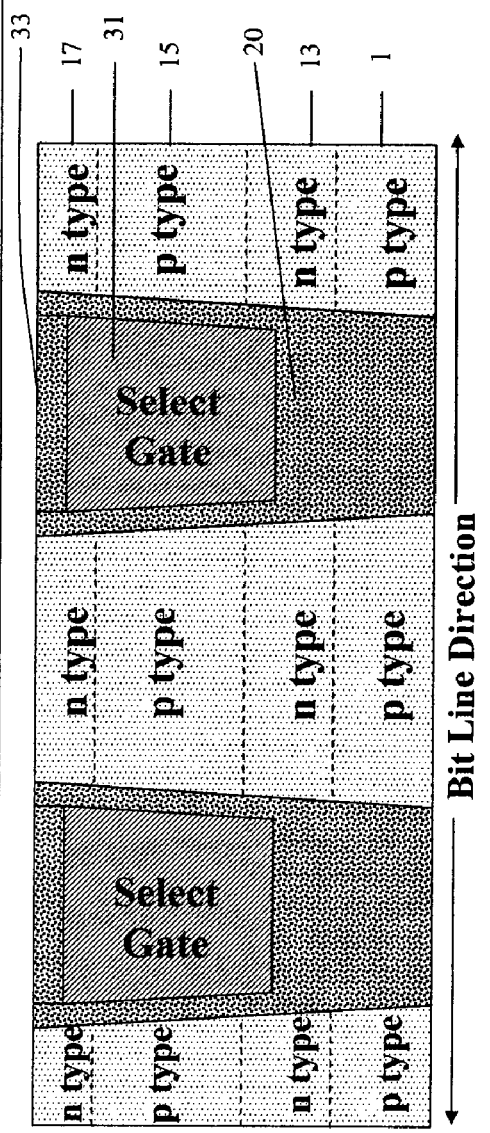

FIGS. 17A and 17B illustrate side cross sectional views of portions of the select transistor of NAND string according to alternative second and third embodiments of the invention.

FIG. 17A a side cross sectional view along the word line direction of the second embodiment in which the lower select transistor 35 is omitted. In this case, the bottom memory cell level is formed over the substrate 1.

FIG. 17B a side cross sectional view along the bit line direction of the third embodiment in which the select gates 31 of the select transistors 35 are formed in trenches in the substrate 1. In this embodiment, a p-type substrate 1 contains an n-p-n structure 13, 15, 17 formed by ion implantation of n-type ions into the substrate 1 to leave a p-type regions of the substrate 15 between the implanted n-type regions 13 and 17. Alternatively, regions 13-17 may be formed by epitaxial layer growth and in-situ doping during growth. Then, trenches are formed by photolithography and etching through the npn structure to the p-type portions of the substrate 1. The trenches are filled with an insulating material 20, such as silicon oxide. The insulating material 20 is then patterned by photolithography and etching to form additional trenches in the material 20. These additional trenches are filled with the select gate material which is then planarized to form the select gates 31. If the select transistor 35 is omitted, then the lowest memory cell 135 may be formed in the trench instead.

In an alternative fourth embodiment, the pillar active regions 25, 125, etc. of the select transistors and/or of the memory cells are formed in polycrystalline semiconductor material 9, 109, etc. Thus, rather than forming epitaxial semiconductor layers 9, 109, etc. on the underlying pillars, an amorphous, microcrystalline or polycrystalline semiconductor layer, such as a silicon layer, is formed on the underlying pillars. This amorphous, microcrystalline or polycrystalline semiconductor layer is then recrystallized to form a large grain polycrystalline semiconductor material layer, such as a large grain polysilicon layer. The recrystallization may be conducted by any suitable annealing method, such as thermal annealing in a furnace, laser annealing and/or flash lamp annealing. This recrystallized layer is then patterned into pillar active regions 25, 125, etc., as described above. The use of low temperature deposited and recrystallized polysilicon allows the active regions to be formed over metal wiring or electrodes which cannot withstand high temperatures.

Thus, the semiconductor active region of an upper memory cell can be formed epitaxially on a semiconductor active region of the underlying memory cell or the semiconductor active regions of one or more first memory cells may be formed in recrystallized polysilicon. The active regions of the lowest level of the memory cells is formed epitaxially or by recrystallization on a semiconductor active region of the select transistor. The active regions of the select transistors are formed epitaxially or by recrystallization over the substrate.

The memory array's size in the lateral dimensions is limited by the RC time constants of the word lines, select gate lines, source lines, and the bit lines. The NAND strings are oriented vertically, and the channel regions (P-regions 115 the NMOS memory embodiment shown) are not grounded. Thus, care has to be taken to manage this floating body potential. The inversion layer on the opposite (non-selected) side can be created and utilized to help anchor the potential of the floating P-type bodies during various operations such as read, program, and/or erase.

Highly doped N and P regions with abrupt junctions may also be used such that floating bodies can be more strongly coupled to one another through thinner depletion regions. Another way of dictating the floating body potentials is through their junction leakages.

Furthermore, boosting for program inhibit should be much more efficient. However, the silicon pillar active regions can be driven as opposed to being boosted, allowing for more abrupt junctions.

Each memory cell and select transistor level is completely self aligned to itself. In other words, no separate alignment steps between device levels is required. Furthermore, each device level only requires two lithography steps—the first step to form the first strips 119 and the second step to form strips 123. The remaining features in each device level are formed by layer deposition and planarization. Thus, at least one region or layer of the NAND string 100, and preferably plural regions or layers are planarized by CMP and/or other methods. For example, for cell 135 the semiconductor active region 125 is planarized when it is in the form of epitaxial layer 109, as shown in FIGS. 11B and 11C), the insulating layer 121 which insulates the NAND string 100 from at least one other adjacent NAND string is planarized as shown in FIG. 13B, and the charge storage dielectric 129, the control gate 131 and the cap layer 133 are planarized as shown in FIGS. 15B and 15C. Thus, at least five layers (not counting the tunneling and blocking dielectrics) are planarized by CMP in each cell 135, 235, etc.

If desired, the silicon wafer substrate 1 may be rotated 45° during all lithography steps so that the wafer notch is not at the 12 o'clock position but at the 1:30 position. In this case, then the vertical side wall channels will be on a [100] crystallographic plane, providing higher channel mobility.

Each device level is not self aligned to the level below it. However, this is of little consequence because the regions where the levels meet is intentionally designed to be the inactive source/drain regions of the NAND chain. The vertical dimensions of each level and the positions of the PN junctions in each level can be different from the other levels based on thermal budgets related to annealing of various levels. Low temperature (such as a temperature below 700° C.) semiconductor epitaxial growth, such as PECVD growth, and plasma oxidation may be employed to minimize level to level variation. This also allows a single high temperature anneal after the forming of all memory and select gate levels. However, separate level by level annealing, or multiple anneal steps for each memory/select level may also be used. If desired, an anneal in a hydrogen ambient may also be conducted.

As noted above, the pillars are preferably rectangular or square when viewed from the side. However, when the trench side walls are not vertical, the active layers, such as the select transistor pillar active region portions 5, will be in the form of truncated pyramids with larger rectangular or square bases than tops. Thus, certain amount of misalignment will not result in variation in contact areas of top of one silicon pillar to the bottom of silicon pillar of the layer above it.

Figure 18A:
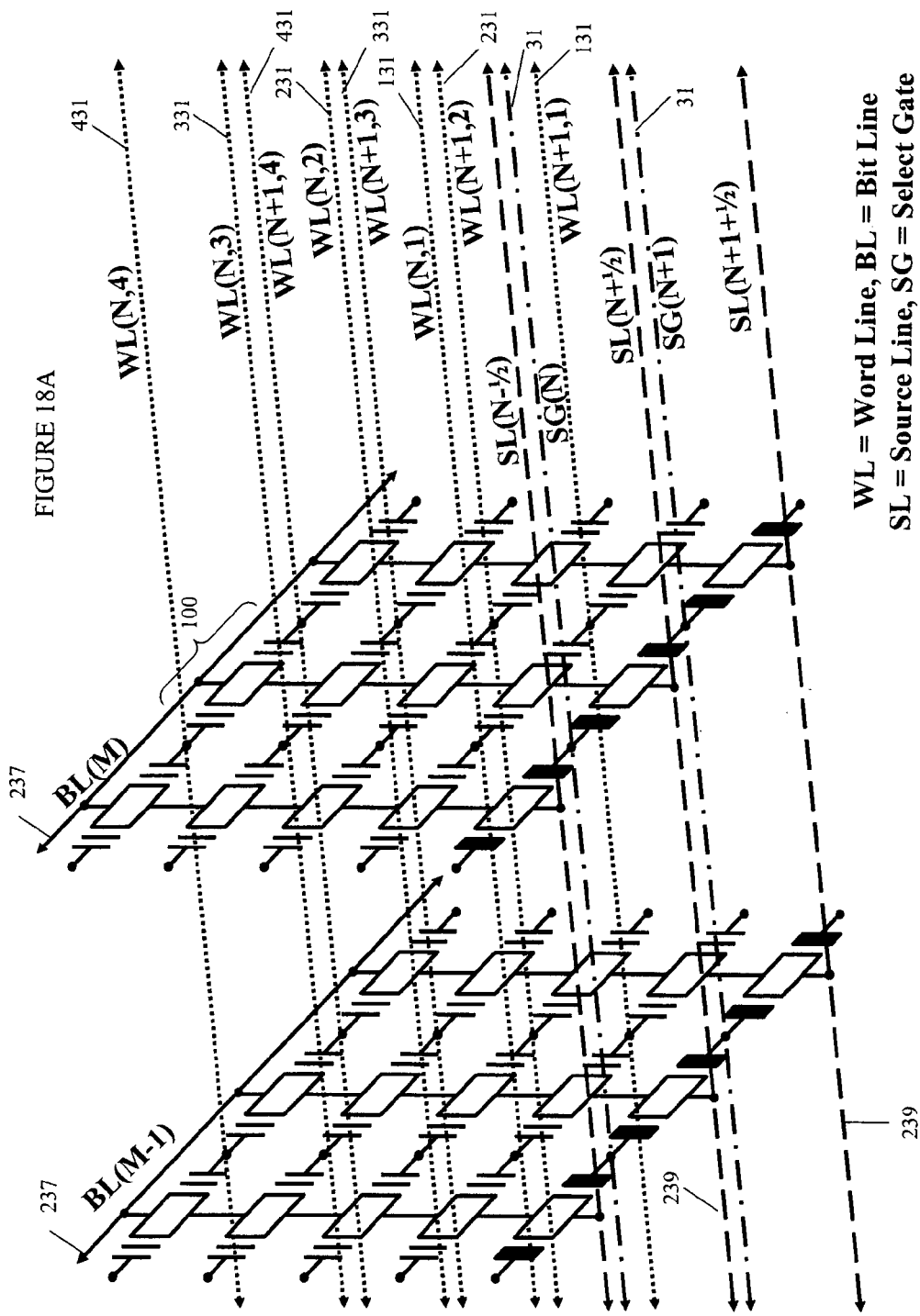
FIGS. 18A and 19 illustrate a circuit schematics of the NAND string of the embodiments of the invention.
Figure 18B:
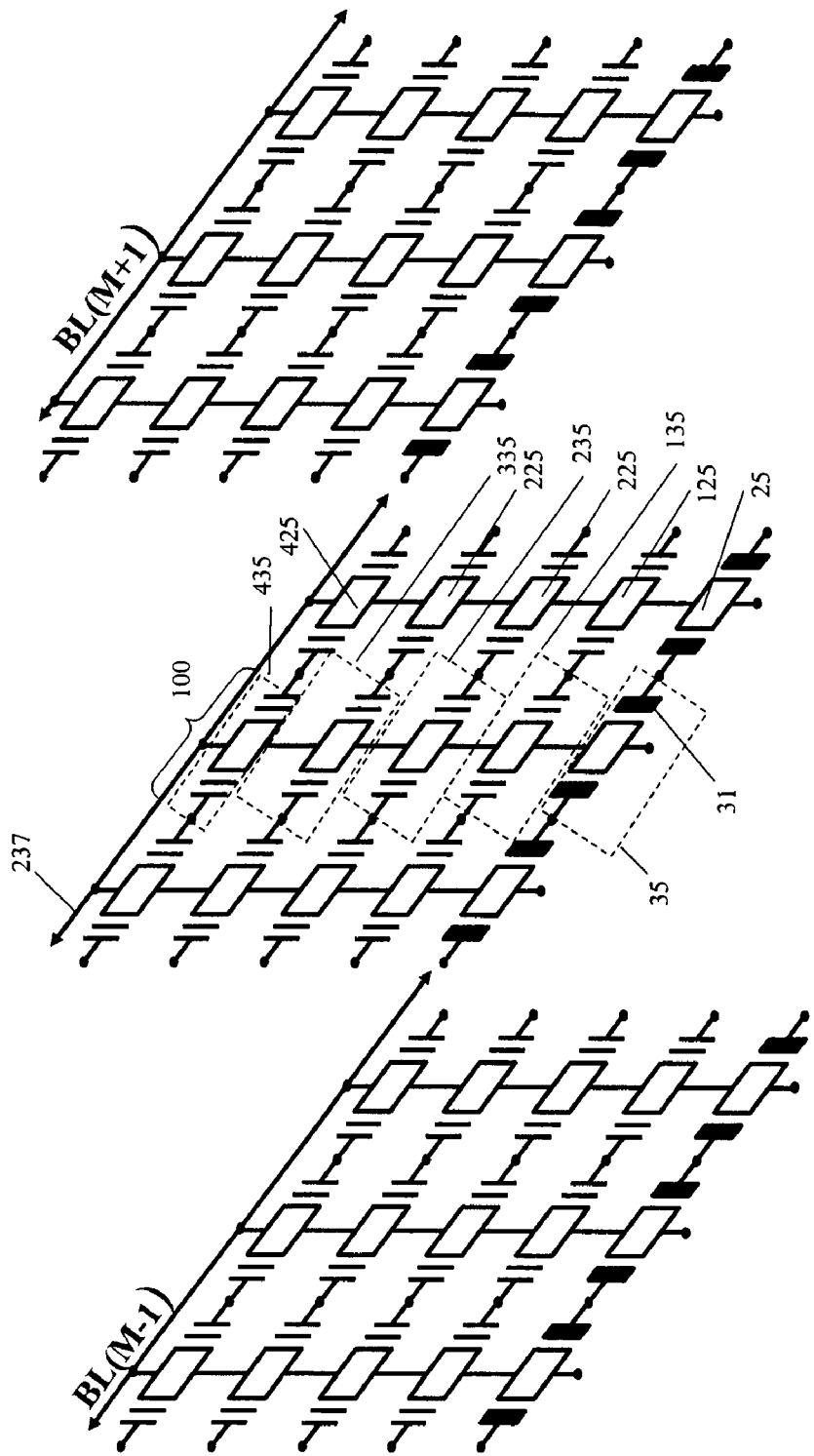
FIG. 18B illustrates a portion of the circuit schematic of FIG. 18A, but with the source lines, select lines and word lines removed for clarity.

FIG. 18A illustrates a circuit schematic of an array of NAND strings described above. FIG. 18B illustrates a portion of the circuit schematic of FIG. 18A, but with the source lines, select lines and word lines removed for clarity. FIGS. 18A and 18B illustrate the select transistors 35, located on a substrate or in a trench in the substrate and at least two levels of memory cells located vertically over the select transistors 35. Each NAND string is depicted as a single column, in which each level of memory cells is located over the underlying level of memory cells. For example, the middle vertical NAND string 100 controlled by bit line 237 in column M includes the select transistor 35 and four memory cells 135, 235, 345 and 445 in four levels. The select transistor 35 is connected to source line SL in row N+1/2. The select transistor 35 is controlled by select gate lines 31 in rows N and N+1. The lowest memory cell 135 is controlled by word lines 131 in rows N and N+1 in vertical level 1 (shown in FIG. 18A as WL (N+X row, Z level), such as WL (N, 1) for word line in row N, level 1). The other memory cells 235, 335 and 445 are controlled by word lines 231, 331 and 441 in rows N and N+1 in levels 2, 3 and 4, respectively. The upper memory cell 445 is electrically connected to the bit line 237 in bit line column M.

Thus, each vertical NAND string includes the select transistor 35 and vertically arranged memory cells 135-445 located one over another. The word lines 131 to 431 are not parallel to the bit line 237. For example, the word lines extend perpendicular to the bit line 237. However, the word lines 131-431 extend parallel to at least one of the source line 239 and the select gate line 31, such as parallel to both the source line 239 and the select gate line 31.

In one alternative embodiment, the word lines in different vertical levels can extend in different directions from each other. For example, the word lines 131 in memory cell level one may extend in a different direction, such as in a perpendicular direction, from the word lines 231 in memory cell level two. The word line direction may be alternated between each memory cell level. For example, the word lines in levels one and three may extend in one direction and the word lines in levels two and four may extend in a different direction. The word line directions may differ by one to ninety degrees from each other. This configuration may reduce coupling between device levels by placing charge storage locations adjacent to different faces of the pillar active regions in adjacent memory cell levels (for example the charge is stored adjacent to north and south faces of the pillar in levels one and three and adjacent to east and west faces in levels two and four).

Figure 19:
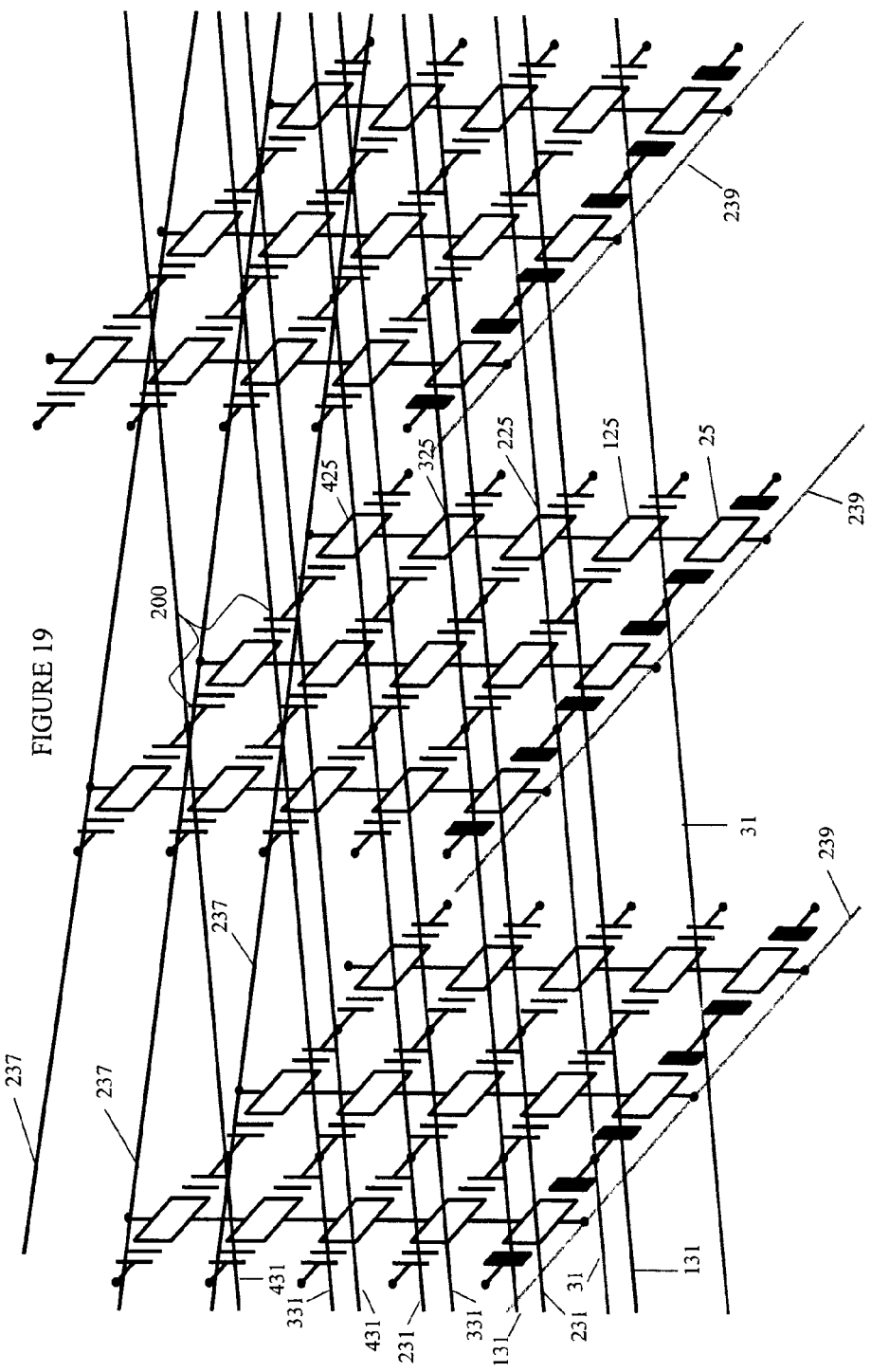

In another alternative embodiment shown in FIG. 19, the bit lines, the word lines and the source lines are not parallel to each other. In other words, the bit lines 237 are not parallel to the word lines 131-431 which are not parallel to the source lines 239 which are not parallel to the bit lines. For example, as shown in FIG. 19, the word lines 131-431 may extend perpendicular to the source lines 239, while the bit lines 237 extend diagonally (i.e., at an angle of 1 to 89 degrees, such as 30 to 60 degrees, for example 45 degrees) with respect to the word lines and the source lines. This allows simultaneous programnming of different multi-state $V_T$ levels to a group of memory cells on the same word line by raising both the source line and bit line of each of the NAND strings to provide a variety of effective programming/inhibit voltages. The current from each bit line sinks to an individually selected source line, thus decreasing the amount of current provided to a particular source line. The diagonal bit lines of FIG. 19 may have a narrower pitch than the bit lines shown in FIGS. 18A and 18B.

If desired, the arrangement may be varied such that the word and bit lines are perpendicular to each other and the source lines are diagonal. The source lines may be formed on top and the bit lines may be formed on the bottom. This allows formation of metal and/or silicide rather than semiconductor source lines, which leads to a decreased current crowding due to the lower resistivity source line material. If desired, all three types of lines may be non-perpendicular to each other and extend diagonally with respect to each other. Preferably, the select lines are parallel to the word lines.

As shown in FIG. 19, each memory cell has a different associated word line, bit line and source line combination that all other memory cells in the array. For example, all memory cells in one row parallel to the word line direction are controlled by different bit lines and different source lines. The configuration of FIG. 19 allows each memory cell in the array to be individually programmed (instead of programming each adjacent pair of cells together) even when two adjacent cells share the same word line, because these adjacent cells are connected to a different combination of bit lines and source lines from each other. For example, two adjacent cells in the same column parallel to one source line are controlled by a different bit line. Thus, two adjacent cells in the same column are associated with the same word line and source line but a different bit line. If desired, the select transistors 31 may optionally be omitted in the configuration of FIG. 19 due to the ability to program each memory cell individually using bit line by bit line control for programming of the cells. However, the programming preferably takes place level by level in each NAND string 200, with alternating levels being programmed sequentially.

In another alternative embodiment, the source lines 239 are be replaced by a common source region (source plane) extending in both dimensions of the plane of the substrate 1 (i.e., in the x-y plane). The common source region may comprise a common conductive plate, such as a highly doped single crystal or polycrystalline semiconductor, silicide and/or metal plate, which electrically contacts the pillar active regions 25 of all select transistors 35 of the array. If the select transistors are omitted, then the source plate contacts the pillars 125 of the lowest memory cell 135 level. The common source plate provides a higher current sinking capability at the expense of loosing the ability to select individual source line voltages.

An alternative embodiment for MLC operation has both source lines and bit lines extending along the same direction to provide means to vary the entire NAND chain voltage on a bit line by bit line basis in order to program cells that are being programmed to higher $V_T$ states faster than cells that are being programmed to lower $V_T$ states. The source and bit line voltages of cells that are being programmed to lower $V_T$ states will be raised in order to retard programming of some these cells, so that the entire set of states in a two or three dimensional configurations will be programmed using fewer program pulses.

The foregoing description of the embodiments of the invention has been presented for purposes of illustration and description. It is not intended to be exhaustive or to limit the invention to the precise form disclosed, and modifications and variations are possible in light of the above teaching or may be acquired from practice of the invention. The embodiments were chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

The invention claimed is:

1. A monolithic, three dimensional NAND string comprising at least a first memory cell located over a second memory cell, wherein:

a semiconductor active region of the first memory cell is formed epitaxially on a semiconductor active region of the second memory cell, such that a defined boundary exists between the semiconductor active region of the first memory cell and the semiconductor active region of the second memory cell;

the semiconductor active region of the first memory cell comprises a first pillar comprising a first conductivity type semiconductor region located between second conductivity type semiconductor regions;

the semiconductor active region of the second memory cell comprises a second pillar comprising a first conductivity type semiconductor region located between second conductivity type semiconductor regions;

one second conductivity type semiconductor region in the first pillar directly contacts one second conductivity type semiconductor region in the second pillar; and the first pillar is not aligned with the second pillar, such that the first pillar extends laterally past the second pillar.

2. The NAND string of claim 1, wherein:

the NAND string is formed vertically over a substrate;

the first memory cell is located in a first device level; and the second memory cell is located in a second device level located over the substrate and below the first device level.

3. The NAND string of claim 1, further comprising a select transistor located below the second memory cell.

4. The NAND string of claim 3, wherein:

the select transistor is located on a substrate or in a trench in the substrate; and the semiconductor active region of the second memory cell is formed epitaxially on a semiconductor active region of the select transistor.

5. The NAND string of claim 1, further comprising:

a first charge storage dielectric located adjacent to the first conductivity type semiconductor region in the first pillar;

a first control gate located adjacent to the first charge storage dielectric;

a second charge storage dielectric located adjacent to the first conductivity type semiconductor region in the second pillar; and a second control gate located adjacent to the second charge storage dielectric.

6. A monolithic, three dimensional NAND string comprising at least a first memory cell located over a second memory cell, wherein:
- a semiconductor active region of the first memory cell directly contacts a semiconductor active region of the second memory cell; and
- the semiconductor active region of at least the first memory cell comprises recrystallized polysilicon.

7. The NAND string of claim 6, wherein:
the NAND string is formed vertically over a substrate;
the first memory cell is located in a first device level; and
the second memory cell is located in a second device level located over the substrate and below the first device level.

8. The NAND string of claim 6, further comprising wiring and a select transistor located below the second memory cell.

9. The NAND string of claim 8, wherein:
the select transistor is located on a substrate or in a trench in the substrate; and
a semiconductor active region of the second memory cell comprises recrystallized polysilicon.

10. The NAND string of claim 9, wherein:
the semiconductor active region of the select transistor comprises a pillar having a square or rectangular cross section when viewed from above; and
the semiconductor active region of the second memory cell comprises a pillar having a square or rectangular cross section when viewed from above, which is not aligned with the semiconductor active region of the select transistor and which extends laterally past the semiconductor active region of the select transistor.

11. The NAND string of claim 6, wherein:
the semiconductor active region of the first memory cell comprises a first pillar comprising a first conductivity type semiconductor region located between second conductivity type semiconductor regions;
the semiconductor active region of the second memory cell comprises a second pillar comprising a first conductivity type semiconductor region located between second conductivity type semiconductor regions;
one second conductivity type semiconductor region in the first pillar directly contacts one second conductivity type semiconductor region in the second pillar; and
the first pillar is not aligned with the second pillar, such that the first pillar extends laterally past the second pillar.

12. The NAND string of claim 11, further comprising:
a first charge storage dielectric located adjacent to the first conductivity type semiconductor region in the first pillar;
a first control gate located adjacent to the first charge storage dielectric;
a second charge storage dielectric located adjacent to the first conductivity type semiconductor region in the second pillar; and
a second control gate located adjacent to the second charge storage dielectric.

13. A monolithic, three dimensional NAND string comprising at least a first memory cell located over a second memory cell, wherein:
at least one region of the NAND string is planarized; a semiconductor active region of the first memory cell directly contacts a semiconductor active region of the second memory cell;
the semiconductor active region of the first memory cell comprises a first pillar comprising a first conductivity type semiconductor region located between second conductivity type semiconductor regions;
the semiconductor active region of the second memory cell comprises a second pillar comprising a first conductivity type semiconductor region located between second conductivity type semiconductor regions;
one second conductivity type semiconductor region in the first pillar directly contacts one second conductivity type semiconductor region in the second pillar;
the first pillar is not aligned with the second pillar, such that the first pillar extends laterally past the second pillar; and
the first pillar comprises recrystallized polysilicon or epitaxially grown silicon on the second pillar.

14. The NAND string of claim 13, wherein:
the NAND string is formed vertically over a substrate;
the first memory cell is located in a first device level; and
the second memory cell is located in a second device level located over the substrate and below the first device level.

15. The NAND string of claim 13, further comprising a select transistor located below the second memory cell.

16. The NAND string of claim 15, wherein:
the select transistor is located on a substrate or in a trench in the substrate;
the semiconductor active region of the select transistor comprises a pillar having a square or rectangular cross section when viewed from above; and
the semiconductor active region of the second memory cell comprises a pillar having a square or rectangular cross section when viewed from above, which is not aligned with the semiconductor active region of the select transistor and which extends laterally past the semiconductor active region of the select transistor.

17. The NAND string of claim 13, further comprising:
a first charge storage dielectric located adjacent to the first conductivity type semiconductor region in the first pillar;
a first control gate located adjacent to the first charge storage dielectric;
a second charge storage dielectric located adjacent to the first conductivity type semiconductor region in the second pillar; and
a second control gate located adjacent to the second charge storage dielectric.

18. The NAND string of claim 13, wherein the at least one region of the NAND string which is planarized comprises a semiconductor active region of the first memory cell.

19. The NAND string of claim 18, wherein the at least one region of the NAND string which is planarized further comprises a control gate of the first memory cell.

20. The NAND string of claim 19, wherein the at least one region of the NAND string which is planarized further comprises:
a semiconductor active region of the second memory cell;
a control gate of the second memory cell; and
an insulating layer which insulates the NAND string from at least one other adjacent NAND string.

* * * * *